United States Patent
Hack et al.

(10) Patent No.: US 7,053,412 B2
(45) Date of Patent: May 30, 2006

(54) GREY SCALE BISTABLE DISPLAY

(75) Inventors: Michael Hack, Lambertville, NJ (US); Stephen R. Forrest, Princeton, NJ (US); Jiangeng Xue, Piscataway, NJ (US)

(73) Assignee: The Trustees of Princeton University and Universal Display Corporation, Ewing, NJ (US)

( * ) Notice: Subject to any disclaimer, the term of this patent is extended or adjusted under 35 U.S.C. 154(b) by 85 days.

(21) Appl. No.: 10/607,138

(22) Filed: Jun. 27, 2003

(65) Prior Publication Data

US 2004/0262614 A1 Dec. 30, 2004

(51) Int. Cl.
*H01L 21/00* (2006.01)

(52) U.S. Cl. .......................................... 257/79; 257/80
(58) Field of Classification Search ................ 257/79, 257/80, 81, 84, 13, 40, 87, 88
See application file for complete search history.

(56) References Cited

U.S. PATENT DOCUMENTS

| | | |
|---|---|---|
| 4,840,460 A | 6/1989 | Bernot et al. |
| 5,153,420 A | 10/1992 | Hack et al. |
| 5,204,661 A | 4/1993 | Hack et al. |
| 5,208,689 A | 5/1993 | Hartmann et al. |
| 5,247,190 A | 9/1993 | Friend et al. |
| 5,264,835 A | 11/1993 | Shaw et al. |
| 5,495,352 A | 2/1996 | Shinjo et al. |
| 5,604,613 A | 2/1997 | Shinjo et al. |
| 5,680,190 A | 10/1997 | Michibayashi et al. |
| 5,796,509 A | 8/1998 | Doany et al. |
| 5,805,136 A | 9/1998 | Silverbrook et al. |
| 5,929,845 A | 7/1999 | Wei et al. |
| 6,016,033 A | 1/2000 | Jones et al. |
| 6,194,119 B1 | 2/2001 | Wolk |
| 6,300,612 B1 | 10/2001 | Yu |
| 6,303,943 B1 | 10/2001 | Yu et al. |
| 6,317,111 B1 | 11/2001 | Nito et al. |
| 6,320,325 B1 | 11/2001 | Cok et al. |
| 6,337,102 B1 | 1/2002 | Forrest et al. |
| 6,361,886 B1 | 3/2002 | Shi et al. |
| 6,366,017 B1 | 4/2002 | Antoniadis et al. |
| 6,392,617 B1 | 5/2002 | Gleason |
| 6,404,137 B1 | 6/2002 | Shodo |
| 6,424,326 B1 | 7/2002 | Yamazaki et al. |

(Continued)

FOREIGN PATENT DOCUMENTS

| | | |
|---|---|---|
| EP | 0361981 | 4/1990 |
| WO | WO 96/19792 | 6/1996 |

OTHER PUBLICATIONS

IBM Technical Disclosure Bulletin, "Gray Scale TFT/LCD Driving", Feb. 1993, pp. 425–426.
Research Disclosure, "Grey Scale expansion with charge sharing pixel configuration", Aug. 1992, 2 pages, No. 340, No. 34043.
P. Peumans, et al., "Efficient, High–bandwidth Organic Multilayer Photodetectors", Appl. Phys. Lett., vol. 76, No. 26, pp. 3855–3857, Jun. 26, 2000.

*Primary Examiner*—David Nelms
*Assistant Examiner*—Thinh T Nguyen
(74) *Attorney, Agent, or Firm*—Kenyon & Kenyon

(57) ABSTRACT

A light emitting device capable of displaying grey scale is provided. The device has a pixel having a plurality of bistable subpixels. Each subpixel has an ON state and an OFF state. A different power line is coupled to each bistable subpixel. Circuitry that can individually modulate the pulse width of a power signal transmitted through each power line is connected to the power lines. Each subpixel includes a first light emitting device the emits light when the subpixel is in the ON state. Each subpixel has substantially the same size and emits substantially the same spectrum of light in the ON state.

12 Claims, 18 Drawing Sheets

U.S. PATENT DOCUMENTS

| | | |
|---|---|---|
| 6,509,574 B1 | 1/2003 | Yuan et al. |
| 6,528,951 B1 | 3/2003 | Yamazaki et al. |
| 6,551,725 B1 | 4/2003 | Raychaudhuri et al. |
| 6,559,594 B1 | 5/2003 | Fukunaga et al. |
| 6,611,108 B1 * | 8/2003 | Kimura .................. 315/169.3 |
| 6,720,942 B1 * | 4/2004 | Lee et al. ..................... 345/82 |
| 2001/0022565 A1 | 9/2001 | Kimura |
| 2001/0026258 A1 | 10/2001 | Yamashita et al. |
| 2001/0033262 A1 | 10/2001 | Funakoshi et al. |
| 2001/0050373 A1 | 12/2001 | Yamazaki et al. |
| 2002/0003201 A1 | 1/2002 | Yu |
| 2002/0017612 A1 | 2/2002 | Yu et al. |
| 2002/0109811 A1 | 8/2002 | Park et al. |
| 2002/0118153 A1 | 8/2002 | Kimura |
| 2002/0122123 A1 * | 9/2002 | Kimura ..................... 348/246 |
| 2002/0122144 A1 | 9/2002 | Yoshida et al. |
| 2002/0140642 A1 * | 10/2002 | Okamoto ..................... 345/76 |
| 2003/0047736 A1 | 3/2003 | Hayashi et al. |
| 2003/0151573 A1 | 8/2003 | Yamaguchi et al. |
| 2003/0230980 A1 | 12/2003 | Forrest et al. |

* cited by examiner

GREY SCALE BISTABLE DISPLAY

FIELD OF THE INVENTION

Joint Research Agreement

The claimed invention was made by, on behalf of, and/or in connection with one or more of the following parties to a joint university corporation research agreement: Princeton University and the Universal Display Corporation. The agreement was in effect on and before the date the claimed invention was made, and the claimed invention was made as a result of activities undertaken within the scope of the agreement.

The present invention generally relates to a grey scale bistable display. More particularly, the invention relates to device configurations and circuitry that may be used to achieve a grey scale bistable display.

BACKGROUND OF THE INVENTION

Organic materials have been proposed for many applications in electronics and opto-electronics due to their low cost and simple device fabrication processes. Many individual devices based on organic materials have been demonstrated in the past two decades.

Organic light emitting devices (OLEDs), which make use of thin films that emit light when excited by electric current, have become an increasingly recognized technology for applications such as flat panel displays. Popular OLED configurations include double heterostructure, single heterostructure, and single layer, as described in PCT Application WO 96/19792, which is incorporated herein by reference.

Recently, progress in OLED transistors, photovoltaic cells, and photodetectors has drawn considerable interest in the field of organic electronics. The use of organic materials in OLED transistors, photovoltaic cells and photodetectors is motivated by a number of advantageous properties. For example, in photodetection, the low index of refraction allows for the efficient coupling of light into devices, and typical optical absorption lengths of ~500 Å allow for the realization of ultra-thin and high-bandwidth devices. These devices can be deposited on a variety of substrates including low-cost, flexible foils, thereby forming a basic building block for molecular organic photonic integrated circuits. Such devices may be used as an input device in an organic transistor circuit in widespread applications.

SUMMARY OF THE INVENTION

A light emitting device capable of displaying grey scale is provided. The device has a pixel having a plurality of bistable subpixels. Each subpixel has an ON state and an OFF state. A different power line is coupled to each bistable subpixel. Circuitry that can individually modulate the pulse width of a power signal transmitted through each power line is connected to the power lines. Each subpixel includes a first light emitting device that emits light when the subpixel is in the ON state. Each subpixel has substantially the same size and emits substantially the same spectrum of light in the ON state.

DETAILED DESCRIPTION

Figure 1:
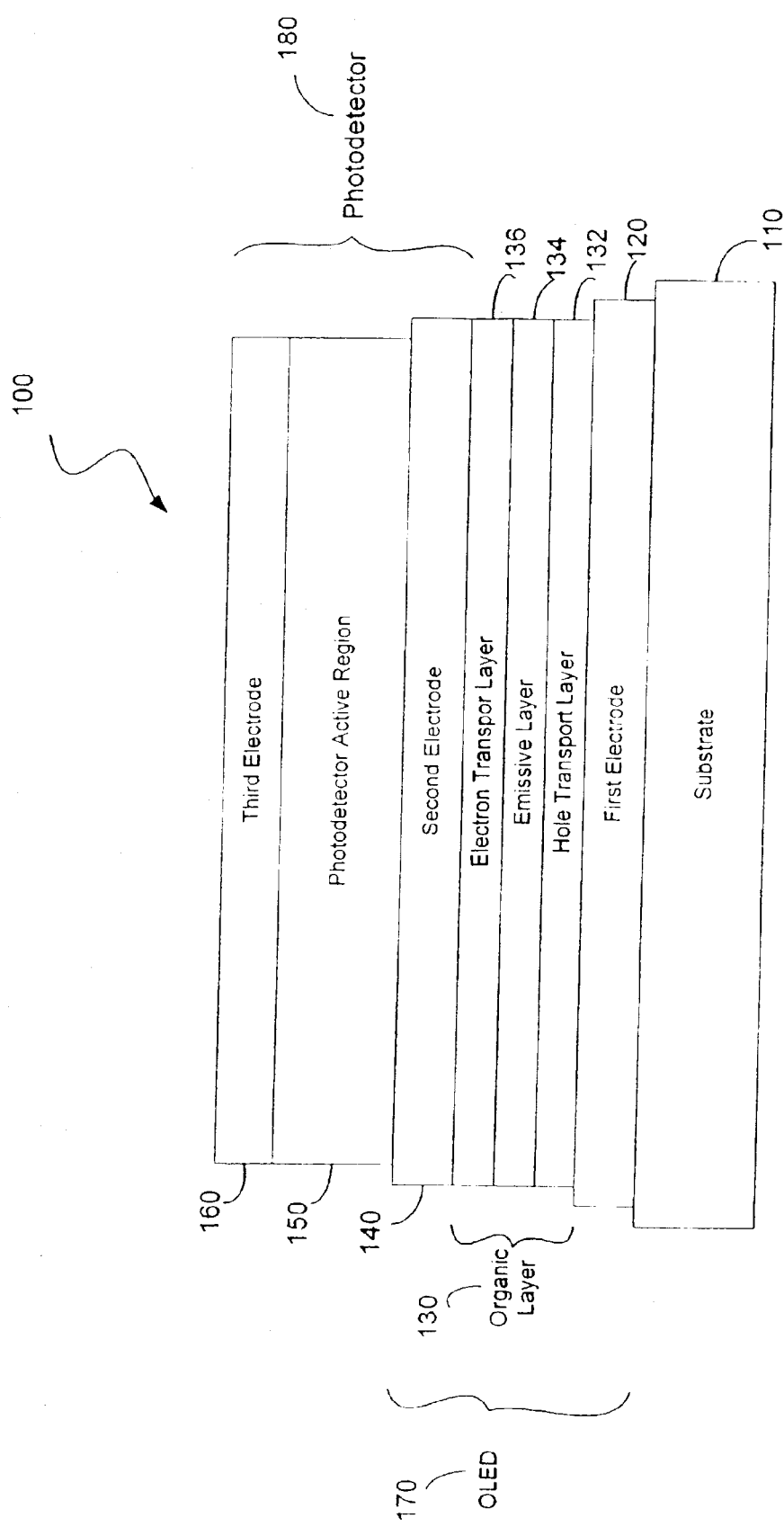
FIG. 1 shows a cross sectional view of a device having an organic photodetector disposed over a transparent electro-phosphorescent organic light emitting device, in accordance with a first embodiment of the present invention.

An integrated device includes an organic photodetector disposed, adjacent to an organic light emitting device (OLED). This integrated device has potential applications in automatic brightness control, image retaining displays and other photonic logic applications.

One application is automatic brightness control. Conventional OLEDs are subject to potential degradation during their life-spans. Each OLED, however, may have a degradation rate different from that of other OLEDs. Some devices, such as a display screen, may include many individual OLEDs and require that most of these OLEDs are emitting a specific amount of light for satisfactory operation. When too many of the OLEDs have degraded, the device may be considered non-functional. Thus, the degradation of only a few OLEDs may make it necessary to replace the entire device, and the useful life of the larger device may be determined by the fastest degrading OLED components. The automatic brightness control provided by embodiments of the present invention compensates for such degradation by increasing the voltage across devices that no longer emit as intensely at the originally specified voltage.

According to embodiments of the present invention, each OLED would be turned on in sequence when the display is initially powered on in a pixelated display application. The intensity of each OLED, or of selected OLEDs (for example one of each color in a full color display) maybe measured by, a corresponding photodetector. Measurements may be stored in a look-up table. Subsequently, the intensity of light of each OLED may again be measured and adjusted to compensate for any differences from the original measurements. Such monitoring may be continuous, or may be performed at certain times, such as upon power-up, periodically, or upon a prompt. In this way, the device may allow each pixel of the display to achieve optimal and stable luminescence throughout the display lifetime.

Furthermore, in accordance with embodiments of the present invention, a bistable device may be achieved with a transistor providing feedback to the integrated device. In its "HIGH" state, the photodetector may be used to turn on a transistor (for example, by generating an appropriate bias voltage across a resistor), which, in turn, provides current to the OLED, thereby maintaining the device in the "HIGH" state. In its "LOW" state, the photodetector does not generate enough voltage across the resistor to turn on the transistor, so the transistor is off and little or no current is provided to the OLED. Accordingly, the device is maintained in its "LOW" state. In this way, bistability of the device is achieved.

As used herein, the term "adjacent to" is broadly defined to include various positions of the photodetector with respect to the OLED. In accordance with one embodiment, the photodetector may be disposed over the OLED. The term "over" is used to indicate a layer that is farther away from a substrate of a device. In accordance with another embodiment, the photodetector may be disposed under the OLED. The term "under" is used to indicate a layer that is closer to a substrate of a device. The photodetector may also be disposed to the side of the OLED. According to another embodiment, the photodetector may be disposed over or under only a portion of the OLED.

Furthermore, as used herein, the term "over" allows for intervening layers. For example, if a second layer is disposed "over" a first layer, there may be a third layer deposited in between the first and second layers. As used herein, the term "on top of" does not allow for intervening layers. For example, if a second layer is deposited "on top of" a first layer, the second layer is in direct physical contact with the first layer, and no layer is deposited in between the first and second layers.

As used herein, a "transparent" layer is a layer that transmits some or all of the light incident upon the layer.

FIG. 1 shows a cross sectional view of a device having an organic photodetector disposed over a transparent electrophosphorescent organic light emitting device, in accordance with a first embodiment of the present invention. Device 100 may be fabricated on a substrate 110 and may include a first electrode 120, an organic layer 130, a second electrode 140, a photodetector active region 150, and a third electrode 160. First electrode 120, organic layer 130, and second electrode 140 may comprise an organic light emitting device (OLED) 170. Organic layer 130 may further comprise a first hole transport layer 132, an emissive layer 134, and an electron transport layer 136 when used in a double heterostructure as shown in FIG. 1. Organic layer 130 may, however, use other combinations of layers known to the art, such as single heterostructure, single layer, and the like. Organic layer 130 may also include other layers known to the art, such as blocking layers. Second electrode 140, photodetector active region 150 and third electrode 160 may comprise a photodetector 180. Photodetector 180 may further comprise other layers known to the art, such as transport layers, and blocking layers. In the embodiment illustrated in FIG. 1, OLED 170 and photodetector 180 may share second electrode 140.

OLED 170 refers to an organic light emitting device with a transparent top electrode. OLED 170 emits light when it is "ON." Some of the light is transmitted through second electrode 140. At least some of the transmitted light is then absorbed by photodetector 180.

Photodetector 180 generates carriers in response to the absorbed light, which may then be measured to provide an indication of the intensity of light emitted by OLED 170. The amount of generated carriers may depend on the bias voltage applied over photodetector 180.

Substrate 110 may be any suitable substrate known to the art, including glass, plastic, metal foil or ceramic. Substrate 110 may also be either flexible or inflexible. Substrate 110 may be transparent or opaque.

First electrode 120 deposited on a substrate 110 preferably functions as an anode, but may function as a cathode. First electrode 120 may be any suitable material or combinations of materials known in the art. First electrode 120 and substrate 110 may be sufficiently transparent to create a bottom emitting device. Where first electrode 120 is transparent, a preferred material is indium-tin-oxide (ITO). The order of organic layers may be adjusted when the first electrode is adapted to function as a cathode. For example, the positions of the hole transporting layer and electron transporting layer may be switched.

In the double hetero-structure configuration shown in FIG. 1, organic layer 130 may further comprise first hole transport layer 132, emissive layer 134 and first electron transport layer 136. Organic layer 130 may also have other configurations known to the art, such as single heterostructure or single layer. Generally, organic layer 130 may include any organic material or combination of organic materials that emit light when a suitable voltage is applied between first electrode 120 and second electrode 140. Examples of suitable materials include 4,4'-[N-(1-naphthyl)-N-phenyl-amino]biphenyl (α-NPD), for first hole transport layer 132, 7 wt % fac tris(2-phenylpyridine)iridium. [Ir(ppy)$_3$] doped with a 4,4-dicarbazole-biphenyl (CBP) host for emissive layer 134, and tris(8-hyroxyquinoline)aluminum (Alq$_3$) or cyano-poly(p-phenylene)vinylene (CN-PPV) for electron transport layer 136.

OLED 170 may further include other layers. Such layer include blocking layers (not shown), adapted to block charge carriers from moving out of emissive layer 134. Such blocking layers are described in more detail in patent application Ser. No. 10/173,682 to Forrest (filed Jun. 18, 2002; published Dec. 18, 2003 as U.S. Published Application 2003-0230980A1), which is incorporated by reference in its entirety. Another such layer is a buffer layer disposed beneath second electrode 140, adapted to protect underlying organic layer 130 during the deposition of second electrode 140. An example of a buffer layer material is bathcuproine (BCP). The OLEDs may be comprised of polymeric OLEDs (PLEDs). Examples of PLEDs are disclosed in U.S. Pat. No. 5,247,190 to Friend et al., which is incorporated herein by reference in its entirety.

Any organic layers of the various embodiments may be deposited by methods known to the art, including thermal evaporation or organic vapor phase deposition (OVPD), such as that described in U.S. Pat. No. 6,337,102 to Forrest et al, which is incorporated by reference in its entirety. Where a polymer organic layer is used, spin-on, spray-on, and ink jet deposition methods may be preferred.

Second electrode 140 may be disposed over electron transport layer 136. Second electrode 140 may be sufficiently transparent that light emitted to OLED 170 may be detected by photodetector 180. Preferably, second electrode 140 acts as a cathode for OLED 170. A preferred second electrode 140 includes a layer of Mg:Ag alloy, deposited over organic layer 130 and a layer of ITO deposited over the layer of Mg:Ag.

Photodetector active region 150 may be disposed over second electrode 140. Photodetector active region 150 may generate carriers in response to the light emitted by organic layer 130. The amount of generated carriers may be dependent on the bias applied voltage over photodetector 180. One suitable structure for photodetector active region 150 is alternating layers of Cu-phthalocyanine (CuPc) and 3,4,9, 10-perylenetetracarboxylic bis-benzimidazole (PTCBI). Sixteen alternating layers, eight alternating layers, or another number of layer may be used. In embodiments of the present invention, the above, mentioned organic alternating multiplayer photodetectors may provide strong optical absorption and relatively high carrier velocities. It would be apparent to one skilled in the art, however, that other photodetector combinations may be used, so long as they may be adapted to detect light.

An highly efficient photodetector active region 150 that absorbs most as all of the light incident upon it may be used for certain applications, such as high contrast displays, where reflection from photodetector 180 transmitted back into OLED 170 is not desired. Alternatively, an inefficient photodetector active region 150 may be used, for example, one that absorbs 5% or less of the light passing through. An inefficient photodetector active region 150, used in conjunction with a reflective third electrode, allows light to be reflected back into OLED 170 and subsequently to a viewer, thereby increasing efficiency.

In the embodiment shown in FIG. 1, photodetector 180 may further comprise other layers, such as a carrier transport layer, a blocking layer, and/or a buffer layer. For example, a second hole transport layer may be disposed between second electrode 140 and photodetector active region 150. The second hole transport layer may be a p-doped semiconductor material. example, 4,4',4"-tris(3-methyl phenylphenyl-amino)triphenylamine (MTDATA) doped with 2 wt % tetrafluoro-tetracyano-quinodimethane ($F_4$-TCNQ) [MTDATA:$F_4$-TCNQ(50:1)] is a suitable p-doped organic semiconductor material for the second hole transport layer.

A buffer layer 155 may be disposed between third electrode 160 and photodetector active region 150. Buffer layer 155 protects photodetector active region 150 from damage during the fabrication of third electrode 160. It has been found that the addition of such a buffer layer 155 may advantageously reduce the dark current of photodetector 180.

Third electrode 160 may be disposed over photodetector active region 150. Third electrode 160 may be any suitable material or combination of materials known to the art. For example, aluminum (Al) or other materials known to the art may be used as third electrode 160. For a top emitting device, third electrode 160 may be a transparent electrode. For a bottom emitting device, third electrode 160 is preferably reflective, so that light may be reflected back toward the viewer. For high contrast bottom emitting displays, third electrode 160 and photodetector active region 150 preferably absorb most or all of the light incident upon them from OLED 170. For fully transparent devices, all electrodes may be transparent.

The specific materials described herein for the various layers are exemplary in nature, and other types of OLEDs and photodetectors may also be used. Many of the specific layers described, such as separate transport layers and blocking layers, may be omitted based on design, performance, and cost considerations.

In one embodiment, an inorganic photodetector may be used in conjunction with an organic light emitting device, such that the inorganic photodetector is disposed adjacent to the organic light emitting device and is adapted to detect light emitted by the OLED. The inorganic photodetector may be based on amorphous silicon polycrystalline silicon, or other photosensitive semiconductors or combinations thereof. The photodetector may be fabricated on a semiconductor backplane. For example, the photodetector may be an inorganic device, such as a silicon diode, fabricated on a silicon backplane, with an organic light emitting device disposed over the photodetector. Such an embodiment may have advantages because circuitry may also be fabricated on the silicon backplane. Other configurations using an inorganic photodetectors may also be used. Other substrate materials and other inorganic photodetectors may be used.

Conventional OLEDs used in OLED-based displays typically degrade in their luminous efficiency over time. Device 100, according to embodiments of the present invention, allows for an in-situ monitoring method for each OLED pixel. Thus, device 100 may determine the amount of light emitted by OLED 170. Thus, the current through OLED 170 can be adjusted to optimize its brightness.

As illustrated in FIG. 1, OLED 170 and photodetector 180 are fabricated in sequences on the same substrate 110. Alternatively, OLED 170 and photodetector 180, as well as other embodiments of the invention, may be grown on separate substrates for subsequent lamination or other attachment.

Figure 2:
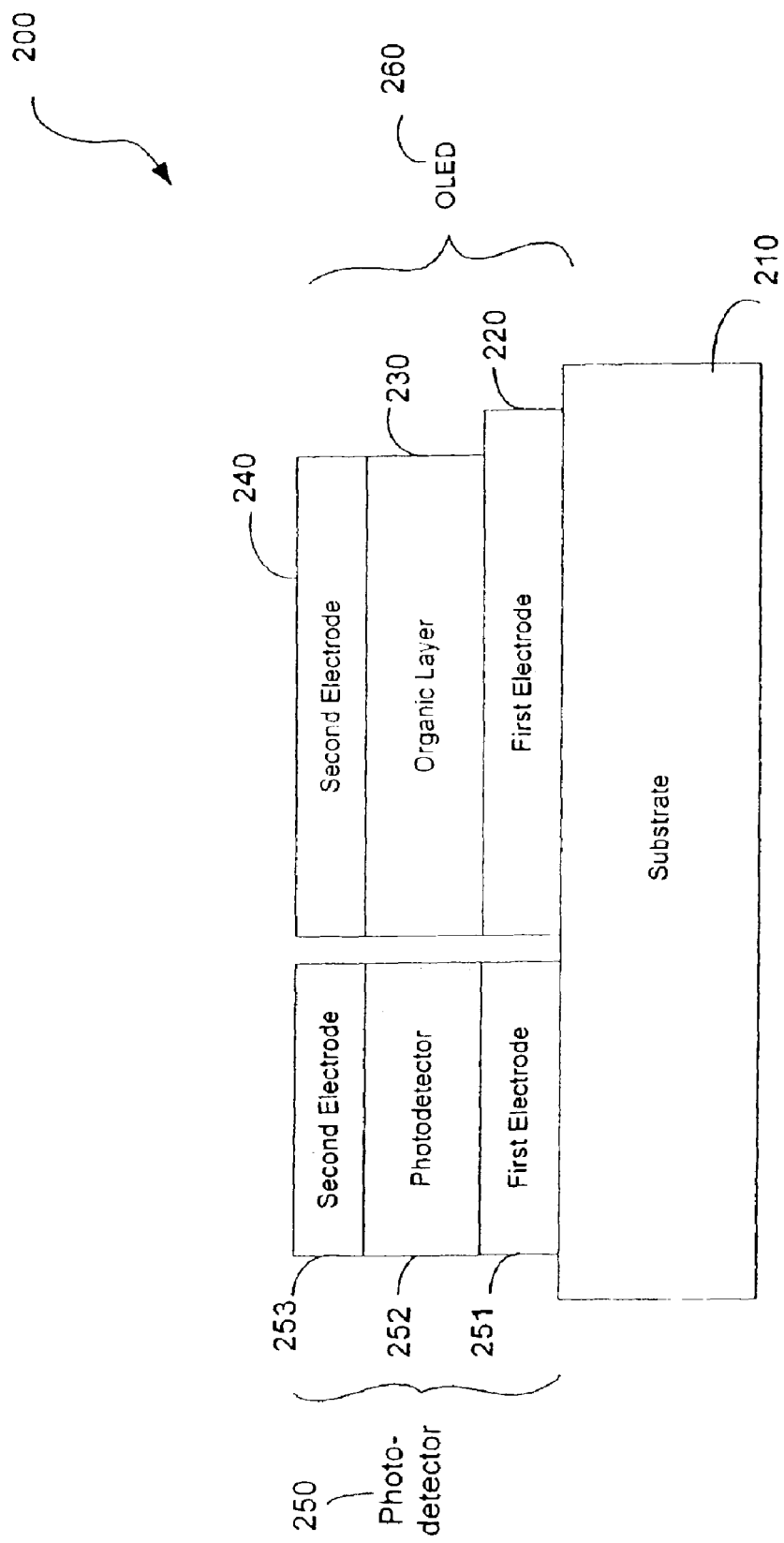
FIG. 2 shows a cross sectional view of a device having an organic photodetector disposed to the side of a transparent electro-phosphorescent organic light emitting device, in accordance with a second embodiment of the present invention.

FIG. 2 shows a cross sectional view of a device 200 having an organic photodetector disposed to the side of an organic light emitting device, in accordance with a second embodiment of the present invention. Device 200 may include a first electrode 220 disposed over a substrate 210, an organic layer 230, a second electrode 240, and a photodetector 250. First electrode 220, organic layer 230 and second electrode 240 may comprise an OLED 260. OLED 260 may comprise other layers as described above with respect to FIG. 1, such as transport layers (not shown), and blocking layers (not shown). Photodetector 250 may be disposed to the side of OLED 260. Photodetector 250 may be further comprised of a first electrode 251, a photodetector active region 252 and a second electrode 253. To simplify fabrication, either the bottom electrodes or the top electrodes may be (but is not necessarily) shared by photodetector 250 and OLED 260. Put another way, first electrode 220 and first electrode 251 may be connected to form a single first electrode, or second electrode 240 and second electrode 253 may be connected to form a single second electrode.

The materials that may be used to fabricate the various layers of device 200 are similar to those of device 100.

Figure 3:
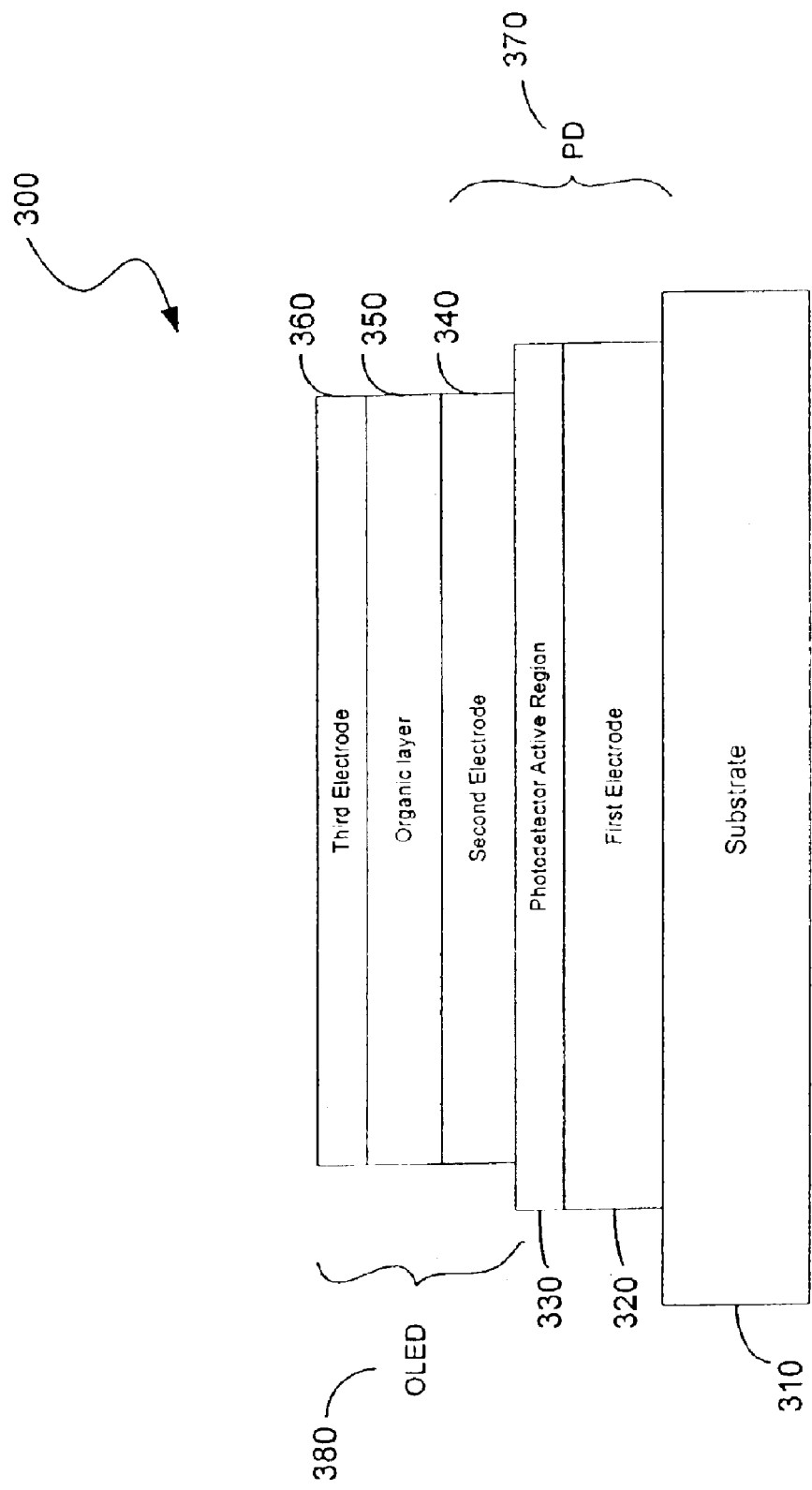
FIG. 3 shows a cross sectional view of a device having an organic photodetector disposed under a transparent electro-phosphorescent organic light emitting device, in accordance with a third embodiment of the present invention.

FIG. 3 shows a cross sectional view of a device having an organic photodetector disposed under an organic light emitting device, in accordance with a third embodiment of the present invention. Device 300 may include a first electrode 320 disposed over a substrate 310, a photodetector active region 330, a second electrode 340, an organic layer 350, and a third electrode 360. First electrode 320, photodetector active region 330 and second electrode 340 may comprise a photodetector 370. Second electrode 340, organic layer 350, and third electrode 360 may comprise a OLED 380.

Device 300, according to the third embodiment of the present invention, may be fabricated in a similar manner and from similar materials as the embodiment shown in FIG. 1, which is described below in greater detail. Device 300 may include layers not specifically shown, such as transport layers, blocking layers, and other layers as described with respect to the embodiment of FIG. 1.

Figure 4:
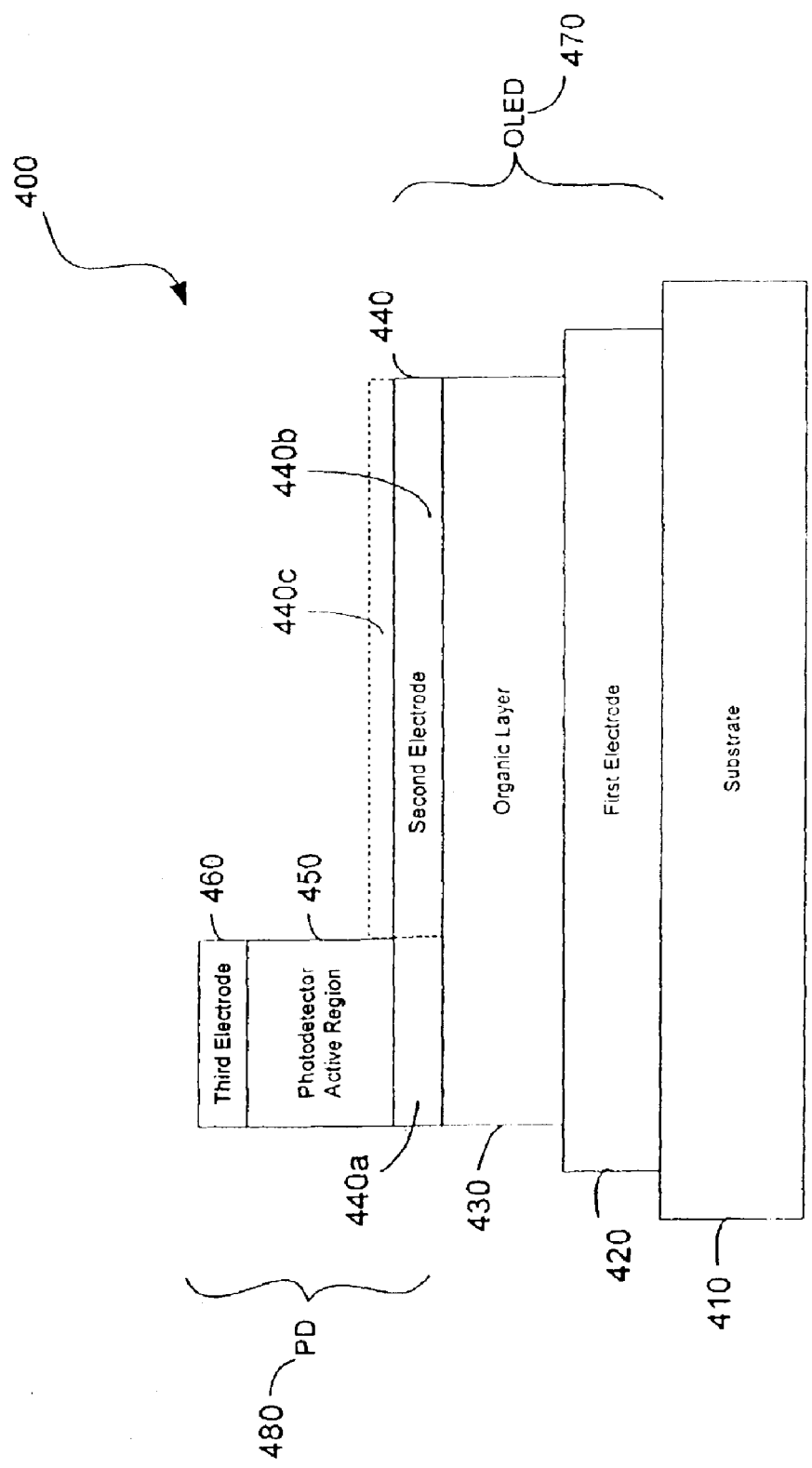
FIG. 4 shows a cross sectional view of a device having an organic photodetector disposed over a portion of a transparent electro-phosphorescent organic light emitting device, in accordance with a fourth embodiment of the present invention.

FIG. 4 shows a cross sectional view of a device having an organic photodetector disposed over a portion of an organic light emitting device, in accordance with a fourth embodiment of the present invention. Device 400 may include a first electrode 420 disposed over a substrate 410, an organic layer 430, a second electrode 440, a photodetector active region 450, and a third electrode 460. First electrode 420, emissive layer 430, and second electrode 440 may comprise an OLED 470. Photodetector active region 450, second electrode 440, and third electrode 460 may comprise a photodetector 480.

Device 400, according to the third embodiment of the present invention, may be fabricated in a similar manner and from similar materials as the embodiment of FIG. 1, which is described below in greater detail. Device 400 may include additional layers, such as transport layers, blocking layers, and other layers as described with respect to the embodiment of FIG. 1.

In one embodiment, photodetector 480 covers at most about ten percent of the top surface area of OLED 470. Preferably, photodetector 480 covers only a small fraction of the surface area of OLED 470, for example, about one percent of the top surface of OLED 470. Photodetector 480 only needs to absorb enough light to provide a sufficient voltage to alter the state of the controlling transistor. The fraction of the top surface area of OLED may be determined based on the photodetector sensitivity and the gain of an external circuit, an example of which is shown and described below in detail with reference to FIG. 5. By reducing the area covered by the photodetector 480, the amount of light absorbed by photodetector 480 is significantly reduced, and OLED 470 may emit more light, increasing the brightness of device 400. Thus, the structure shown in FIG. 4 may increase efficiency of device 400.

In this embodiment, electrode 440 may be a single electrode all fabricated by the same method. Or, electrode 440 may have two portions, a first portion 440a disposed under photodetector active region 450, and a second portion 440b that is not disposed under photodetector active region 440b. First portion 440a may be at least partially transparent, to allow light from organic layer 430 to reach photodetector active region 450. Particularly for bottom emitting OLEDs, second portion 440b may be reflective. The different properties of first portion 440a and second portion 440b may be achieved by first fabricating a transparent electrode, for example ITO/Mg:Ag, in both portions. Then, a reflective layer 440c may be deposited over portion 440b, either before or after photodetector 480 is fabricated. The different properties of first portion 440a and second portion 440b may also be achieved by fabricating different electrodes, for example a transparent ITO/Mg:Ag electrode for first portion 440a, and a reflective LiF doped with Al electrode for second portion 440b. Light emitted by organic layer 430 incident upon second portion 440b may be reflected back towards a viewer in a bottom emitting OLED, thereby increasing efficiency of device 400.

In another embodiment, a photodetector may be disposed under only a portion of the OLED. This embodiment may have a photodetector disposed under an OLED as illustrated in FIG. 3, but the photodetector may be much smaller than the OLED as shown in FIG. 4.

Figure 5:
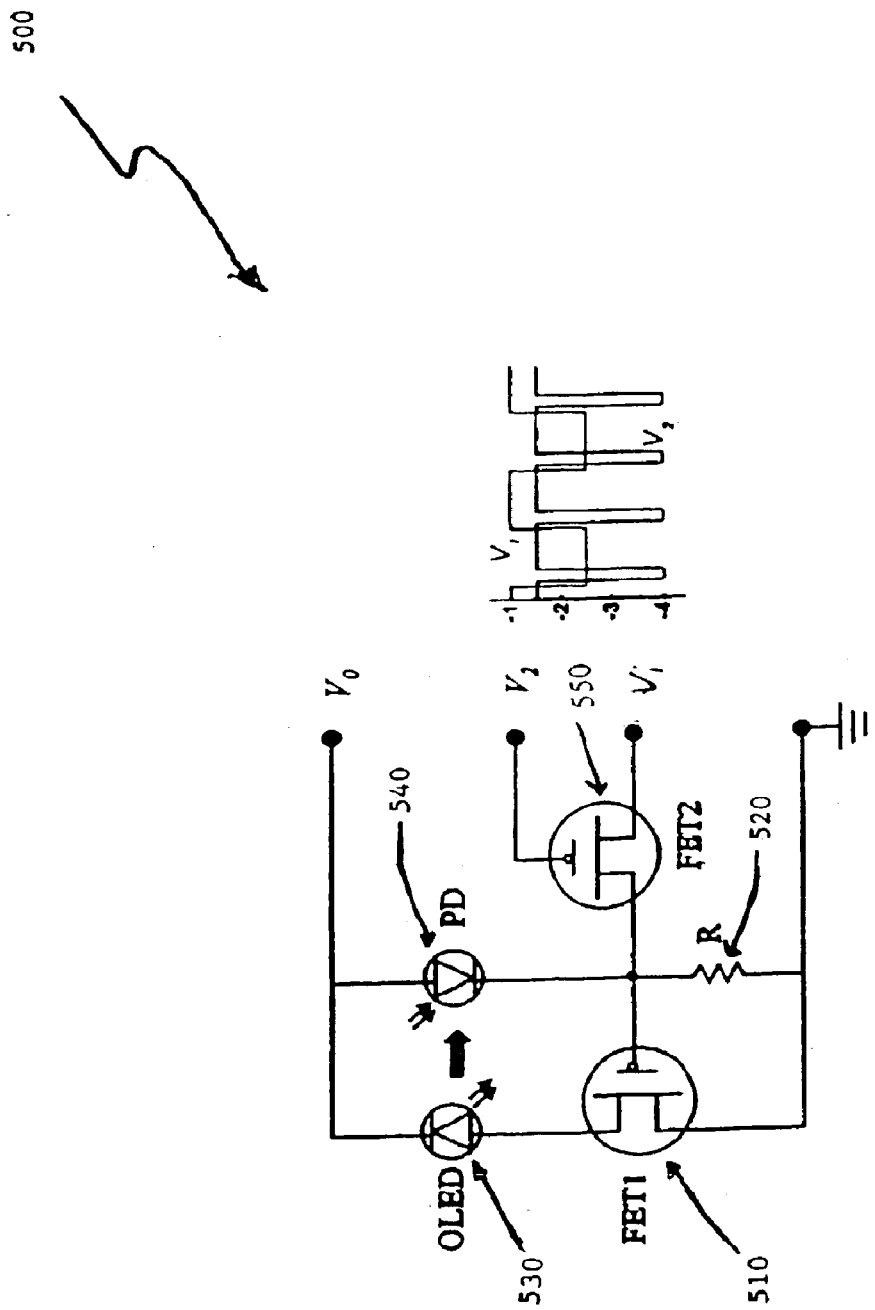
FIG. 5 shows a switching device for enhancing bistability of an embodiment of the present invention.

Each of the embodiments, including those illustrated in FIGS. 1-4, may be used in connection with a bistable switch. FIG. 5 illustrates a first bistable switching circuit 500 for an embodiment of the present invention. The bistability of an OLED 530 and a photodetector 540 may be achieved with the use of a transistor 510 and a resistor 520, as shown in circuit 500 of FIG. 5. In an example actually fabricated, an intrinsic p-type organic field effect transistor is used as transistor 510. There are two stable direct current (DC) operating points of this system the "LOW" and "HIGH" states, which may be switched by a signal transmitted through a second transistor 550. Other circuits may be used to achieve the same result.

In the LOW state, OLED 530 does not emit light, so that the current passing through photodetector 540, $I_{PD}$, is solely its dark current. By choosing an appropriate resistance "R" for resistor 520, the gate voltage of transistor 510 may be selected such that, in the low state, the gate voltage is between the threshold voltage of transistor 510 and zero ($V_{T1} < V_{g1}^{1} < 0$, where $V_{T1}$ is the threshold voltage of T1 510, $V_{g1} = -|I_{PD}| \cdot R$ 520 is the gate voltage of transistor 510, and the superscript "l" represents the LOW state). Hence, transistor 510 remains off to maintain the LOW state of OLED 530.

In the HIGH state, OLED 530 emits light that is directly coupled into photodetector 540 through the transparent cathode of OLED 530, which generates a photocurrent. The properties of photodetector 540 and resistor 520 may be selected such that this photocurrent results in a gate voltage for transistor 510 that is higher than the threshold voltage of that transistor, $V_{g1}^{h} < V_{T1} < 0$, where the superscript "h" represents the HIGH state, such that the HIGH state is maintained. Second transistor T2 550 may be adapted to provide pulses in order to toggle bistable switch 500 between HIGH and LOW states, as shown in FIG. 5. Circuits other than the one specifically illustrated in FIG. 5 may be used.

The dark current of photodetector 540 under reverse bias increases exponentially with $\sqrt{|V_{PD}|}$, where $V_{PD}$ is the bias voltage of photodetector 540. In the LOW state, photodetector 540 may be subjected to a larger reverse bias because the voltage on photodetector 540 may be less than, zero ($V_{PD} = V_S - V_{g1} < 0$, where $V_S < 0$ is the supply voltage). Thus, it is preferable to suppress the dark current.

Figure 6:
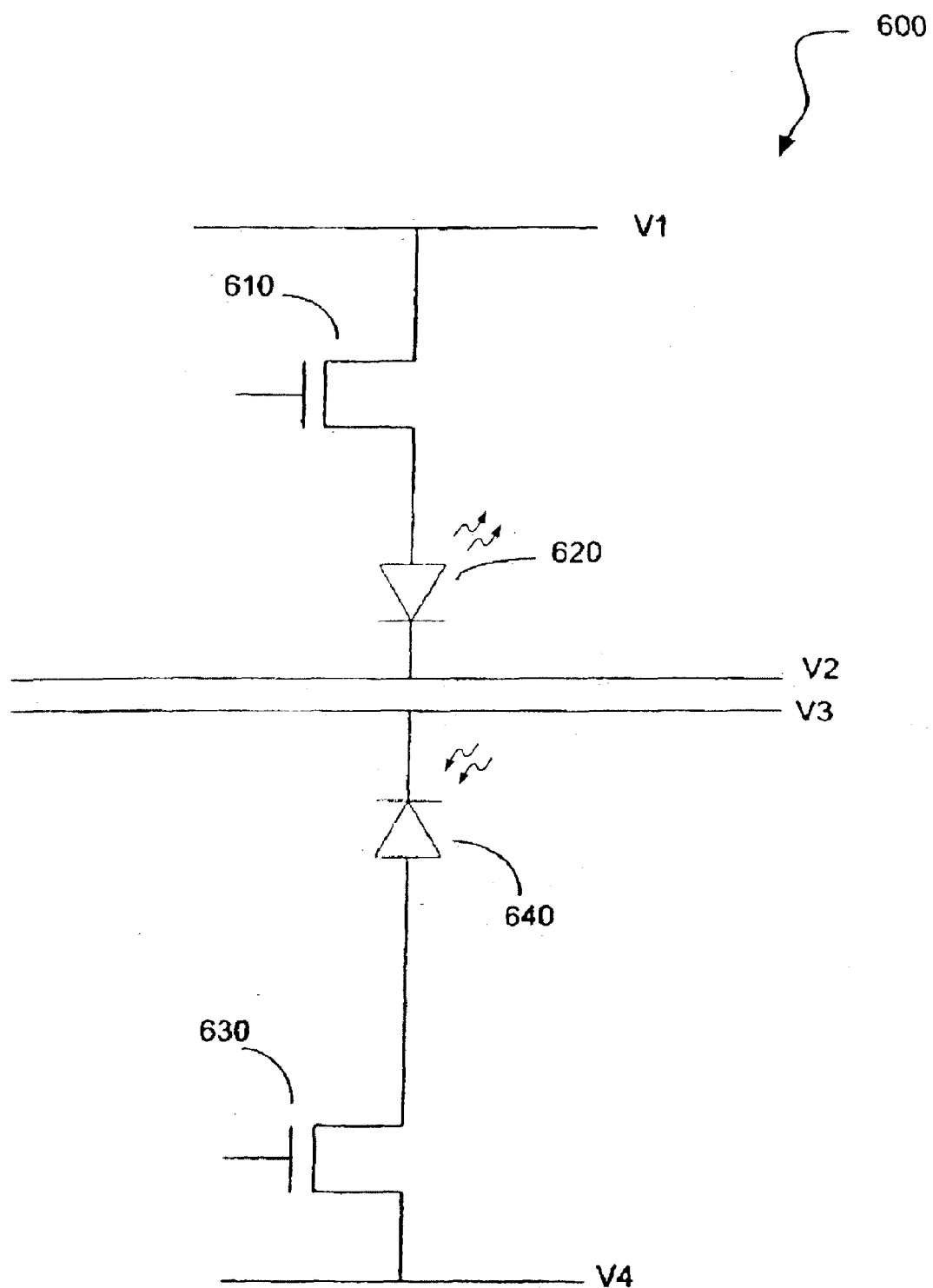
FIG. 6 shows a brightness control circuit for an embodiment of the present invention.

FIG. 6 shows a brightness control circuit 600 for an embodiment of the present invention. Circuit 600 includes a first transistor 610 with its drain connected to an OLED 620 and its source connected to a first reference voltage source, V1. OLED 620 is also connected to voltage V2. Circuit 600 also includes a second transistor 630 with its source connected to a voltage source V4, and its drain connected to a photodetector 640. Although not shown in FIG. 6, OLED 620 provides light to photodetector 640 as illustrated, for example, in FIGS. 1–4. A pulse may be provided at the gate of transistor 630, and the voltage between V3 and V4 read by external circuits. The voltage difference between V3 and V4 provides a measure of the amount of light being emitted by OLED 620, because photodetector 640 is absorbing some of that light. External circuits may further be used to control the gate voltage of transistor 610 and/or the voltage difference between V1 and V2, to adjust the amount of light being emitted by OLED 620. The brightness of OLED 620 may therefore be maintained at a desired level.

The various circuits used in connection with the present invention may be external or internal. "Internal" as used to describe a circuit means that the circuit is locally fabricated on the same substrate as the OLED and photodetector, and is generally disposed on the substrate very close to the OLED with which the circuit is associated. "External" describes all other circuits, for example circuits that are connected to the OLED and photodetector by bus lines that run to the edge of an array of devices, and external circuits may be fabricated on a different substrate.

Figure 7:
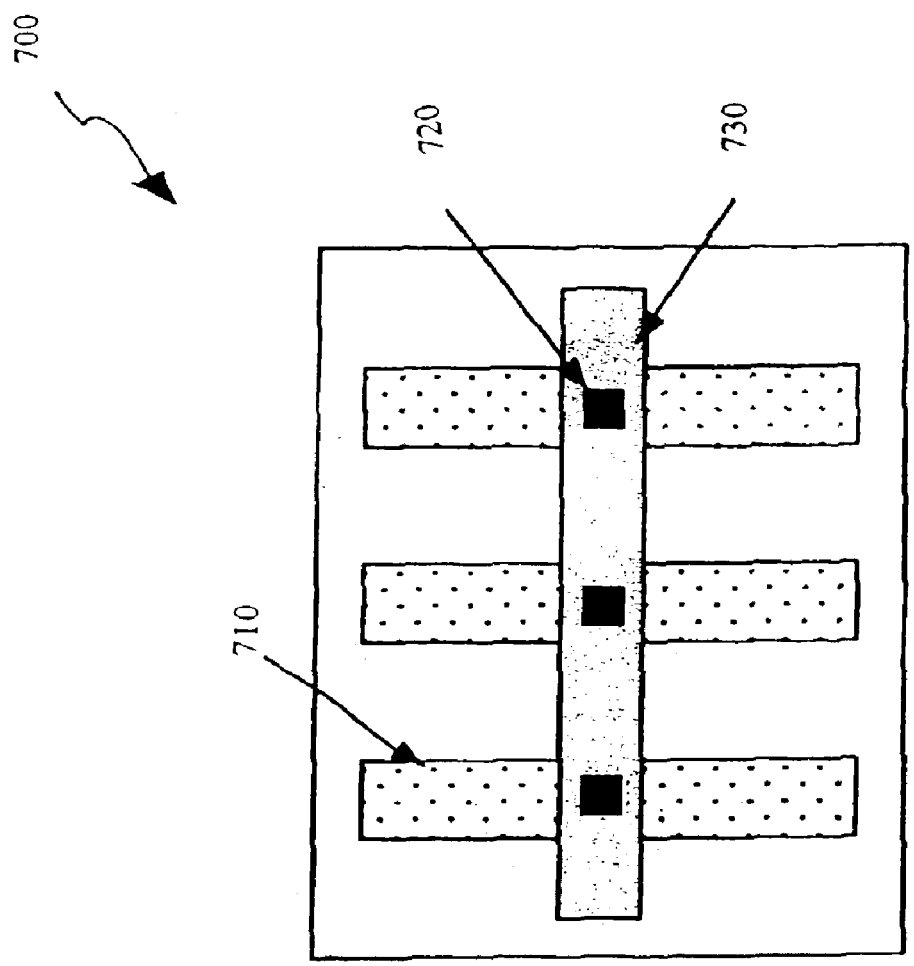
FIG. 7 shows a top view of a device fabricated in accordance with an embodiment of the present invention.

FIG. 7 shows a top view of a device 700 fabricated in accordance with an embodiment of the present invention. Device 700 includes a plurality of first electrode strips 710. A second electrode strip 730 is disposed perpendicularly over first electrode strips 710. A third electrode 720 is disposed over second electrode strip 730 at the intersection of first electrode strips 710 and second electrode strip 730. The organic layers of an OLED (not shown) may be disposed between first electrode strips 710 and second electrode strip 730. The photodetector active region (not shown) of a photodetector may be disposed between second electrode strip 730 and third electrode strip 720. FIG. 7 illustrates a particular configuration that was used for experiments, and it is understood that many configurations of electrodes, including conventional active matrix and passive matrix configurations, may be used in connection with embodiments of the present invention.

A bistable pixel may remain in an ON or OFF state, in effect storing information about the pixel state locally. A data signal is only needed for such a pixel when it is desired to change the state of the pixel. As a result, the information data flow to the pixel array is reduced, thereby reducing display power consumption. However, a bistable device is generally either ON or OFF, and does not generally allow the brightness of an individual device to be changed during operation. While the embodiment of FIG. 6 may be used to control the brightness of individual devices, it may require the use of control circuitry for each individual pixel that, while not exceedingly complex, is also not simple. Accordingly, there is a need for a way to use bistable devices to create a display capable of displaying multi-grey scale level displays, with very simple circuitry.

According to embodiments of the present invention, each pixel may comprise a plurality of bistable subpixels, which enable multiple grey levels. Each subpixel may have an ON state and an OFF state and may emit substantially the same spectrum of light. Each subpixel may be set to either its ON or OFF state based on a given application, thus providing different combinations of ON/OFF state subpixels, which result in different grey scale levels.

Figure 14:
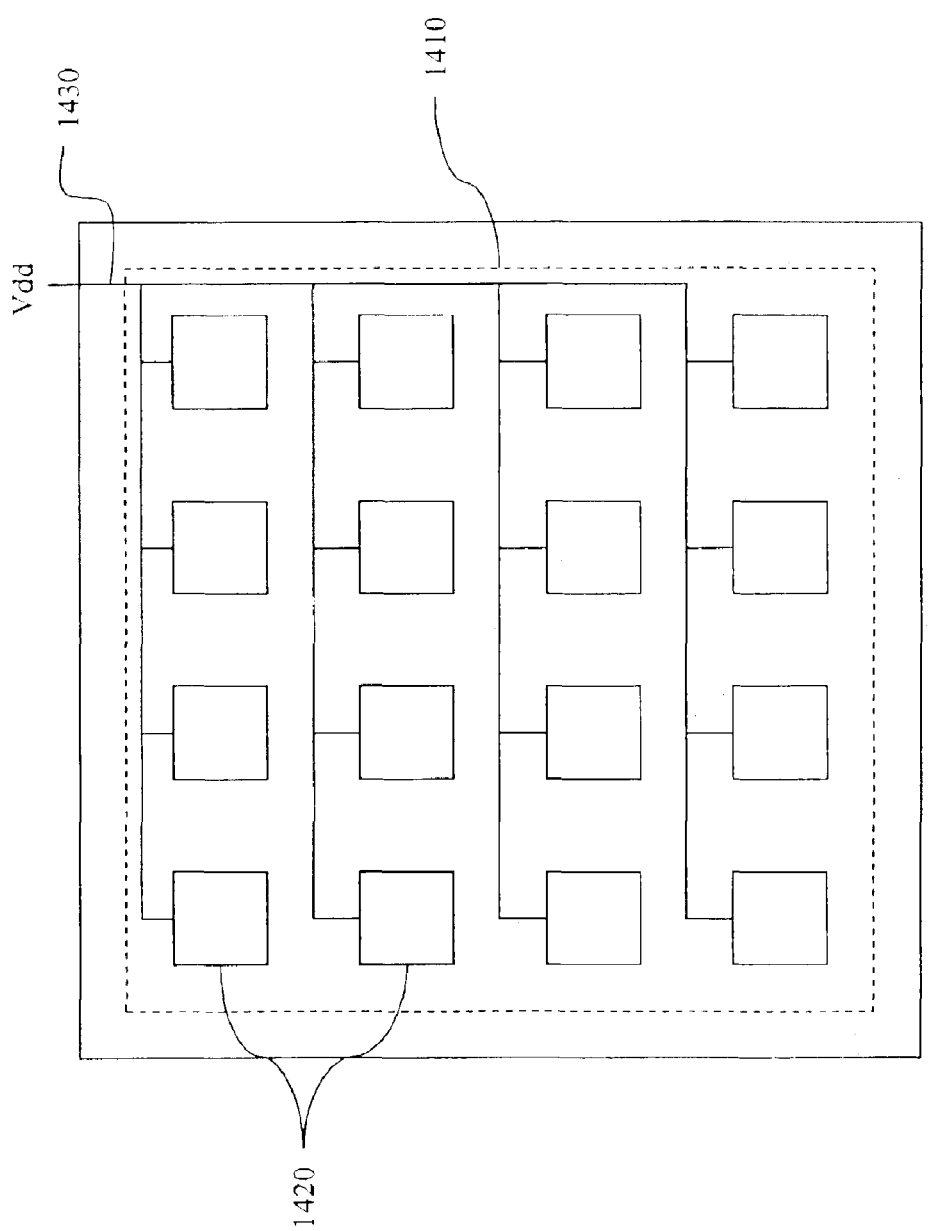
FIG. 14 shows a diagram of a pixel having multiple subpixels, where each subpixel has substantially the same area and emits substantially the same spectra of light at substantially the same intensity.

FIG. 14 shows an approach to obtain a greyscale pixel that uses multiple bistable subpixels, each having the substantially the same area and designed to emit substantially the same spectra of light at substantially the same intensity. Each pixel 1410 has a plurality of subpixels 1420. Each subpixel may have an ON state and an OFF state. In one embodiment, each pixel includes 16 subpixels 1420, which are disposed in a 4×4 matrix, as illustrated in FIG. 14. The same driving voltage Vdd may be applied to each subpixel via bus lines 1430. Each of these subpixels 1420 may be set to either its ON or OFF state using circuitry such as that shown in FIGS. 5 and 6, or other circuitry able to acheive a similar result. Different ON/OFF state combinations of these sixteen subpixels may constitute different grey scale levels. Thus, in this embodiment, the pixel 1410 may have seventeen grey scale levels, including one state where all subpixels are off, depending upon how many subpixels are turned on. The number of different grey scale levels that may be achieved using the approach illustrated by FIG. 14 is n+1, where n is the number of subpixels per pixel. To provide more grey levels, the number of subpixels may be increased for each pixel.

Figure 15:
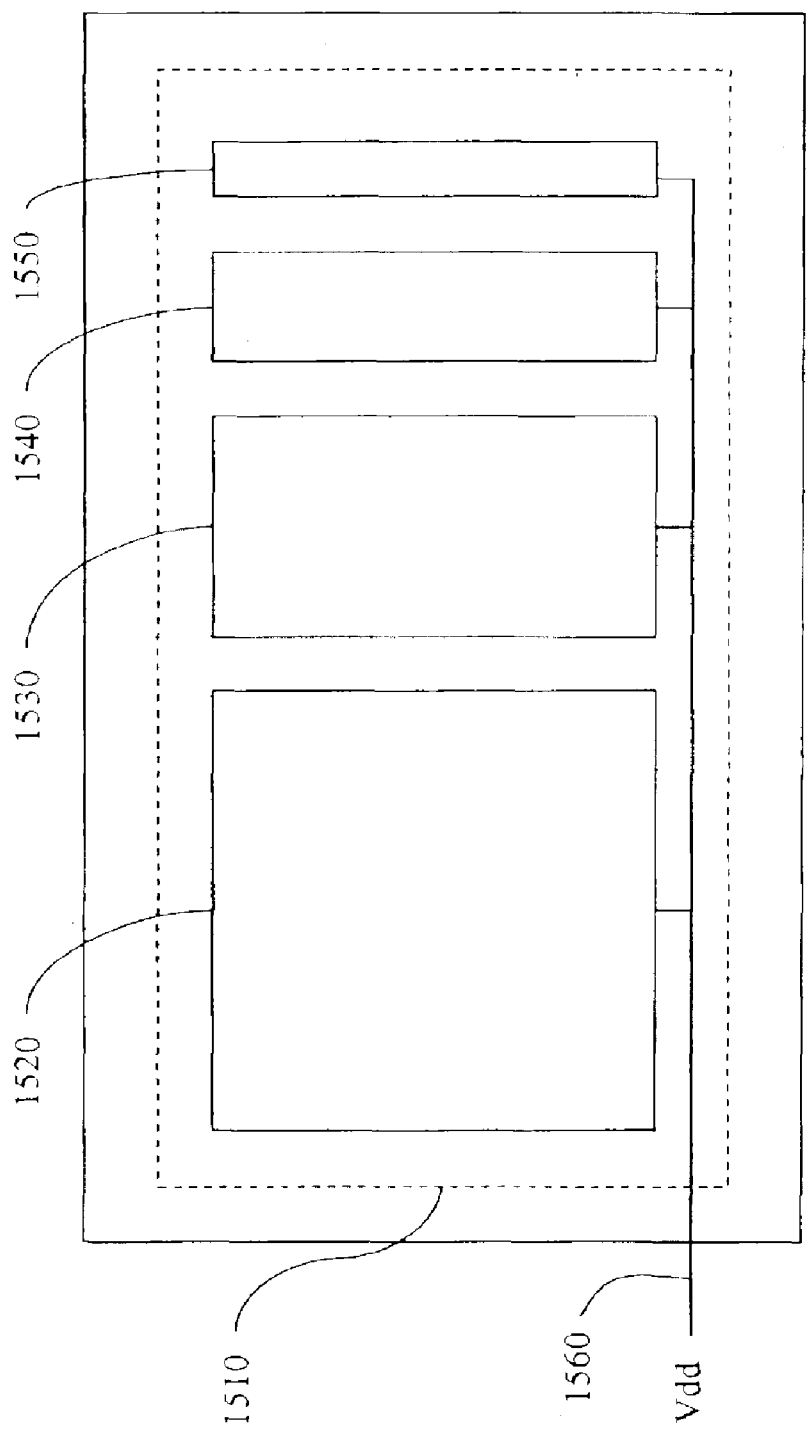
FIG. 15 shows a diagram of a pixel having multiple subpixels, where the subpixels may have different areas, and where each subpixel emits substantially the same spectra of light at the same intensity.

A pixel having different grey scale levels may be achieved by using a pixel having bistable subpixels with different areas that emit substantially the same spectra of light at substantially the same intensity. FIG. 15 illustrates an embodiment of such a pixel, pixel 1510, which has four subpixels 1520, 1530, 1540 and 1550. Each subpixel has an area that is 50% of the preceding subpixel, i.e., subpixel 1530 has 50% of the area of subpixel 1520, subpixel 1540 has 50% of the area of subpixel 1530, and so on. The subpixels are designed to be driven at the same intensity per unit of surface area, such that the total intensity of light emitted by a subpixel is proportional to its surface area. Thus, the subpixels may be driven by the same drive voltage Vdd carried by the same bus line 1560. The number of grey scale level that may be achieved by the specific approach illustrated in FIG. 15 is $2^n$, where n is the number of subpixels per pixel. The approach of FIG. 15 allows for a greater number of grey scale levels per subpixel than the approach of FIG. 14. Using subpixels having different areas, however, may complicate fabrication and reduce fill-factor. Specifically, the inactive border around each subpixel may have a width determined by manufacturing constraints, such that the inactive region necessitated by small subpixels such as subpixel 1550 is proportionally larger than the comparable inactive region necessitated by a larger subpixel, such as subpixel 1520. Also the requirement of different subpixel sizes may adversely affect the display resolution that may be obtained, as manufacturing considerations may constrain the size of the smallest subpixel, and much larger subpixels must also be fabricated.

Figure 16:
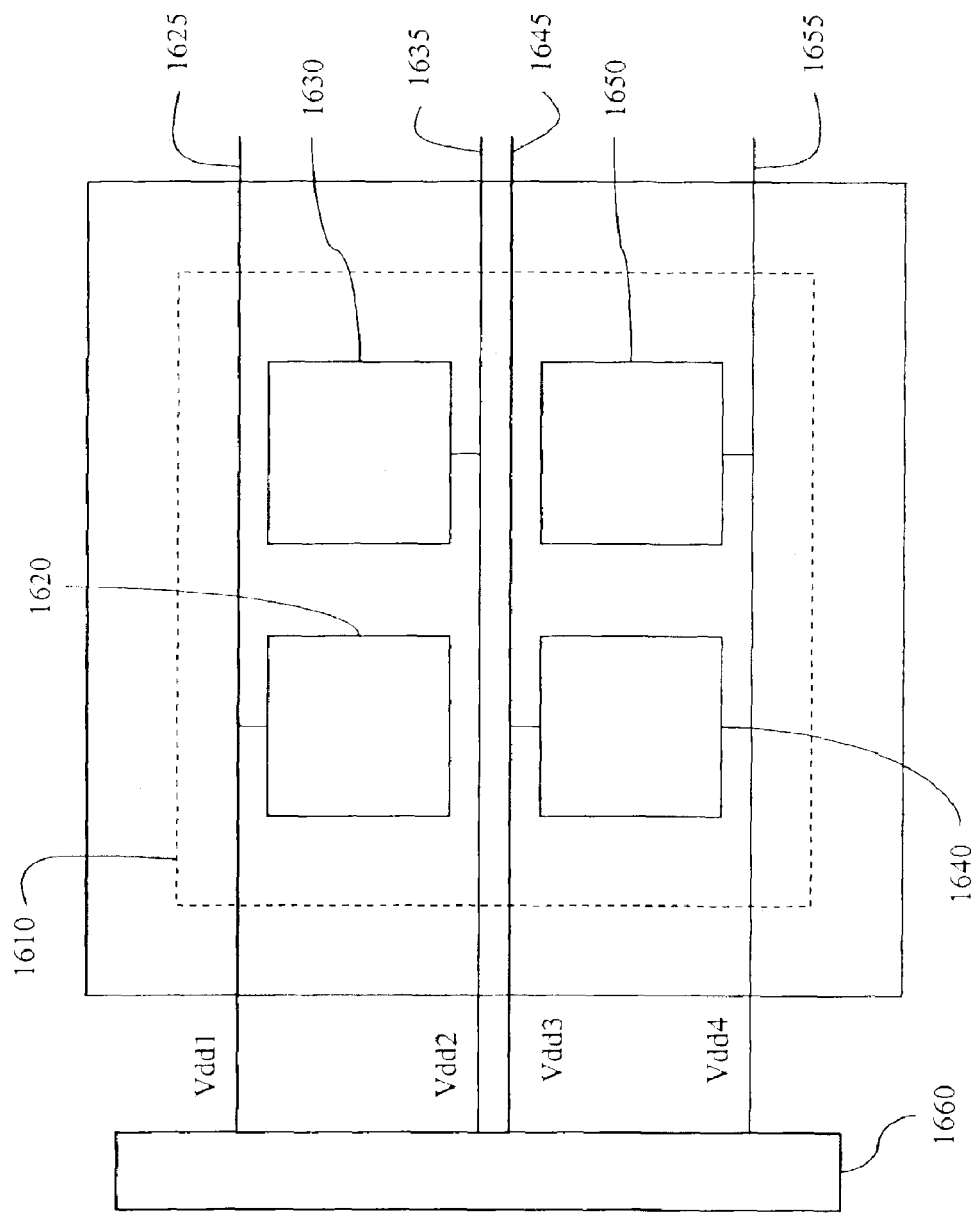
FIG. 16 shows a diagram of a pixel having multiple subpixels, where the subpixels have substantially the same area, and emit substantially the same spectra of light at different

In a preferred embodiment, a pixel having multiple grey scale levels using bistable subpixels may be achieved by using subpixels having substantially the same area and emitting substantially the same spectra of light in the ON state, but at a different time-averaged intensity. The subpixels may be driven in a different manner while in the ON state such that each subpixel emits a different amount of light over a given time period. FIG. 16 illustrates such an embodiment. Pixel 1610 includes bistable subpixels 1620, 1630, 1640 and 1650. Each subpixel has substantially the same area, and emits substantially the same spectra of light in the ON state. The subpixels may emit different intensities of light.

The intensity of light emitted by a subpixel may be controlled in a number of ways. In one embodiment, the voltage across a subpixel may be reduced to reduce the intensity of light emitted by the subpixel. However, the intensity of light emitted by a subpixel may not have a simple linear dependence on voltage, and the relationship between voltage and intensity may changeover time as the subpixel ages. As a result, complex circuitry associated with each subpixel may be needed to ensure that the proper voltage is applied to achieve desired reductions in intensity for various subpixels, and to ensure that the voltage is properly adjusted over time.

The intensity of light emitted by a subpixel may also be controlled by increasing the frequency of the addressing signal that controls the subpixel. For example, if the frame rate is 60 times every second, the frame can be broken down into "subframes" and addressed at a faster rate, such as 120 times per second or 240 times per second, and flickered on and off to acheive grey scale. However, this approach requires excessive use of data signals to control grey scale, as well as complex addressing circuitry. Moreover using subframes to control grey scale levels is contrary to the idea of a bistable subpixel, which only requires a data signal to change the state of the subpixel between ON and OFF, regardless of the grey scale level being displayed by the subpixel.

As illustrated in FIG. 16, each subpixel may be connected to a different bus line (or power line). Bus lines 1625, 1635, 1645 and 1655 are connected to subpixels 1620, 1630, 1640 and 1650, respectively, and carry power signals Vdd1, Vdd2, Vdd3 and Vdd4, respectively. Each power line may provide a different amount of energy to the subpixel to which it is connected. This may be achieved in a number of different ways, such as providing a different voltage, or by providing the same peak voltage but for a different percentage of the time.

In a preferred embodiment, pulse width modulation of the power signal is used to control the intensity of a subpixel. Specifically, the amount of energy provided to a subpixel is controlled relative to the amount of energy provided to other subpixels by varying the amount of time that power is provided. For example, Vdd1 may provide power all of the time, Vdd2 may provide power 50% of the time, Vdd3 nay provide power 25% of the time, and Vdd4 may provide power 12.5% of the time. As a result, Vdd2 provides 50% of the energy provided by Vdd1, and so forth. The frequency of the power signal is preferably sufficiently great that a viewer does not notice that a subpixel is flickering between on and off. Rather, the viewer perceives the subpixel as emitting light of a reduced intensity, depending upon the amount of time that the subpixel is emitting light. This intensity may be referred to as the "time-averaged luminance." In fact, the peak luminance (and the corresponding peak voltage) emitted by each subpixel is preferably the same, such that the differences in the time-averaged luminance emitted by each subpixel are due solely to the fraction of time that each subpixel is emitting light. It is believed that the perceived intensity of a subpixel is a simple linear function of the amount of time that the subpixel is emitting light. As a result, a subpixel having 50% of the time-averaged luminance of another subpixel may be achieved by providing a power signal that provides power for only 50% of the time. Circuitry that controls the power provided by power lines 1625, 1635, 1645 and 1655, such as circuitry 1660, is well within the skill of one of skill in the art in view of this disclosure. The frequency with which the power in each line is turned on and off may be sufficiently great that the effect is not visible to the human eye. The circuit used to maintain the bistable subpixels in the ON or OFF states may have a decay constant such that the cycling of the power in each power line does not change the ON or OFF state of a subpixel. As with the embodiment of FIG. 15, $2^n$ grey scale levels may be achieved, where n is the number of subpixels. Depending upon how pixel intensity varies with with the amount of power provided, the duty cycles may be adjusted such that subpixel 1620 provides full intensity subpixel 1630 provides 50% intensity (time averaged luminance), subpixel 1640 provides 25% intensity, and soon. Using subpixels that have substantially the same area may significantly facilitate fabrication and fill factor. However, because some subpixels are not driven at full intensity, the overall brightness of the pixel when all of the subpixels are ON may be less than other embodiments. It is believed that the simplicity of fabrication may outweigh this consideration, particularly for pixels having a small number of subpixels, such as 2–4 subpixels, such that the reduction in overall brightness is not too great.

In a further refinement of the embodiment illustrated in FIG. 16 and similar embodiments, the particular subpixel that provides a particular intensity may be rotated to enhance lifetime. Preferably, this rotation is periodic. In particular, the subpixel connected to the power line Vdd that is always on, such that the subpixel provides 100% intensity, is expected to have a shorter lifetime that the other subpixels, which are connected to power lines that provide power only a fraction of the time. The subpixels that provide a particular intensity of light may be periodically rotated by simply changing which power line provides power for a fraction of the time. Circuitry, such as circuitry 1660, for achieving this is well within the capabilities of those of skill in the art. For example, after the display described above is operated for a period of time, such as a day, a rotation may occur such that Vdd1 provides power 12.5% of the time, Vdd2 provides power 100% of the time, Vdd3 provides power 50% of the time, and Vdd4 provides power 25% of the time. Similar rotations may occur after further periods of operation. The effect of this rotation will extend the lifetime of the overall pixel, much as rotating tires on a vehicle extends tire lifetime.

It is known to use bus lines to mitigate limitations on the electrical conductivity of a transparent electrode. In the context of a passive matrix array of OLEDs, the bus line is a thick electrically conductive strip that runs parallel to a transparent electrode, and which provides electrical conductivity, in the direction of the electrode. For example, U.S. Pat. No. 6,016,033 to Jones et al. discloses the use of a bus line in an array of OLEDs. Because the bus line is made of a thick electrically conductive material, it does not transmit light, and unfavorably results in an inactive area on the array of OLEDs. Because it is desirable to maximize the active area of an OLED display, it is desirable to minimize the area of the bus line. The active area may be quantified by a "fill-factor." Because of the enhanced electrical conductivity that is provided by a bus line, a bus line may be used notwithstanding the disadvantageous inactive area.

The embodiment of FIG. 16 may be controlled using circuitry similar to that illustrated in FIG. 5, or other circuitry. Optical or electrical feedback may be used to maintain the ON or OFF state of a subpixel. Power lines may be shared by multiple pixels. For example, a single power line may be used to carry a voltage Vdd1 with a particular duty cycle one subpixel in every pixel of the display, or to every pixel in a column or row of a display.

Figure 17:
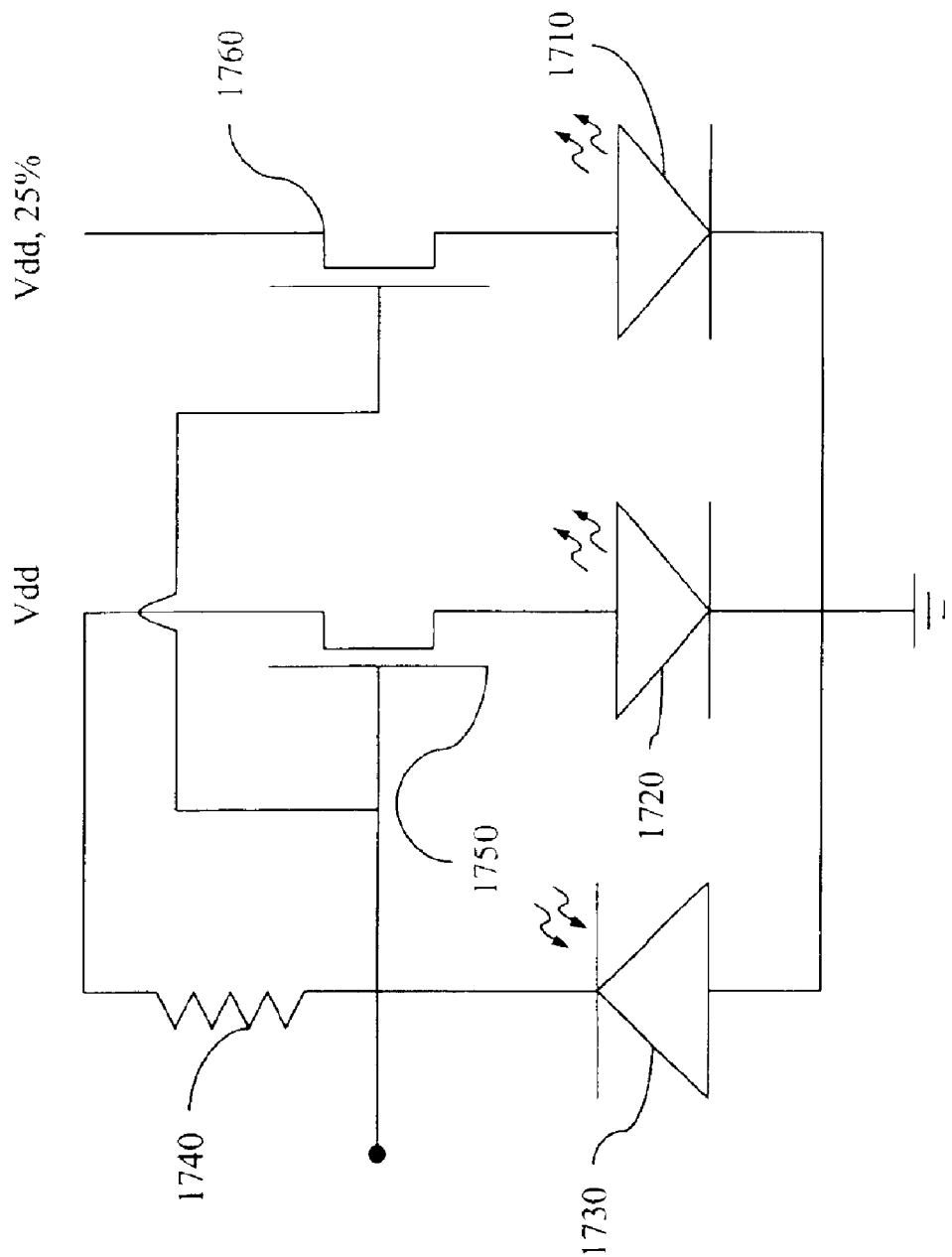
FIG. 17 shows an example of a circuit that uses optical feedback to maintain the ON or OFF state of a subpixel.

FIG. 17 shows an example of a circuit that uses optical feedback to maintain the ON or OFF state of a subpixel, even where power is supplied to the primary light emitting device of a subpixel for a fraction of the time. The circuit has a first OLED 1710, a second OLED 1720, a photodetector 1730, a resistor 1740, a first transistor 1750, and a second transistor 1760. First OLED 1710 is primarily responsible for the light that is transmitted to a viewer, although it is not neccesarily that all light from OLED 1720 be blocked from reaching the viewer. Preferably, if any light from OLED 1720 reaches a viewer, that light has the same spectra as light emitted by OLED 1710. Second OLED 1720 is responsible for providing optical feedback to photodetector 1730 when the subpixel is in an ON state. Preferably, OLED 1720 is small relative to OLED 1710, and OLED 1720 is disposed directly over photodetector 1730. The power line that powers second OLED 1720 may be uniform, i.e. always on or "unmodulated," such that the light emitted by OLED 1720 is not interrupted when the subpixel is in the ON state. Because the primary purpose of OLED 1720 is to provide optical feedback, as opposed to light for the viewer, OLED 1720 may be small relative to OLED 1710. OLED 1710 may be powered by a power line that only provide power for a fraction of the time. Even when OLED 1710 is not receiving power, OLED 1720 continues to provide optical feedback if the subpixel is in the ON state. The state of the subpixel may be changed by applying a signal to the gate of transistor 1750. Other circuits may also be used to provide feedback, whether optical or electrical, to maintain an OLED in an ON state even if the OLED is only powered for a fraction of the time when it is in the ON state.

Figure 18:
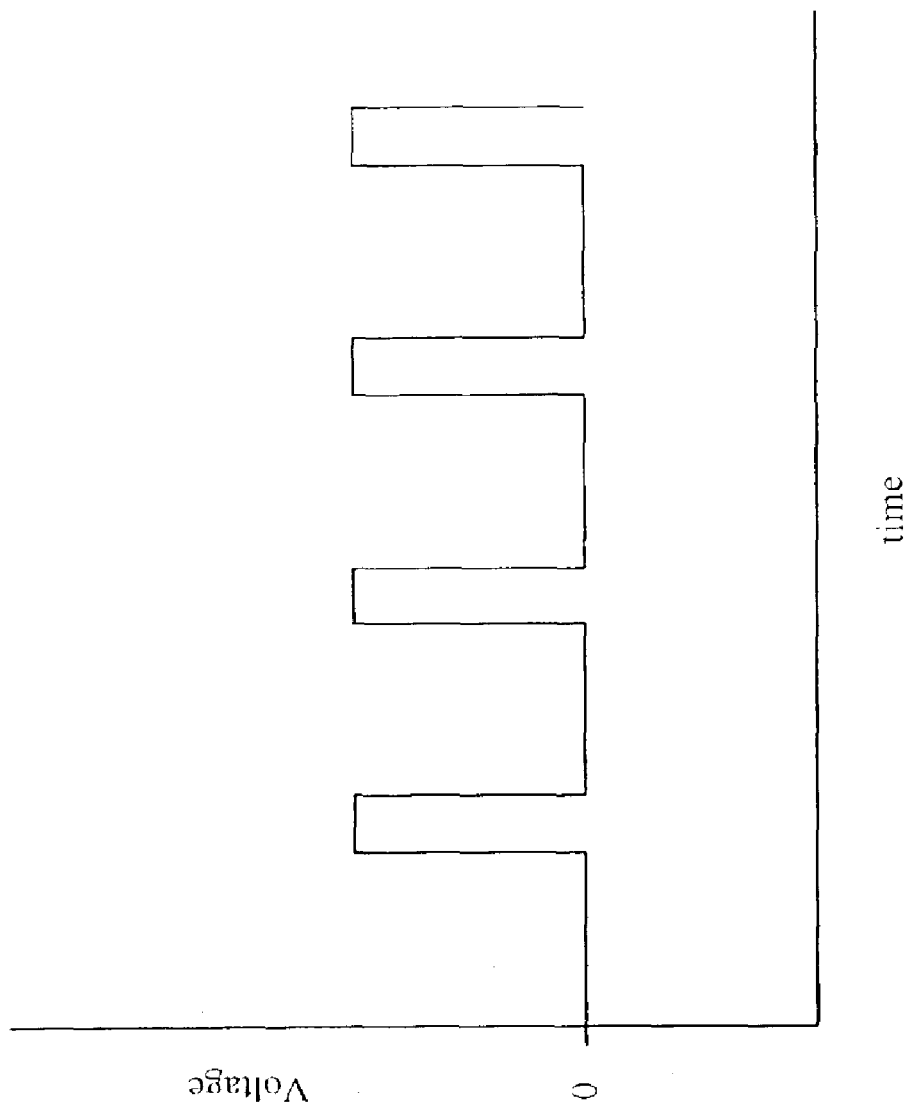
FIG. 18 shows an example of an applied voltage that provides power to an OLED for only a fraction of the time

FIG. 18 shows an example of an applied voltage that provides power to an OLED for only a fraction of the time. The applied voltage is a square waveform, with a zero amplitude for a fraction of the time, and a constant amplitude different from zero for the fraction of the time that the OLED is in the ON state. Preferably, the frequency of the waveform is great enough that flicker from the OLED can not be detected by the human eye. Other waveforms may be used.

Controlling time-averaged luminance using pulse width modulation (i.e. the amount of time that power is provided) is particularly favorable, because providing power for 50% of the time gives 50% time averaged luminance, and does not depend the characteristics of the OLED, which may change over time. Also, there is no need to calibrate the OLED to determine what magnitude of uniform power signal is required to generate a desired luminance. The relation between the, amplitude of the power signal and the luminance may be more complex. Pulse width modulation to control luminance is also preferred, because it does not require that the intensity of a subpixel be stored in circuitry, either on the substrate or elsewhere.

The bistable photonic integrated circuit according to embodiments of the present invention has several potential applications in displays. Specifically, the photonic integrated circuit may have particular applications for devices in which bistable pixels can significantly reduce the bandwidth needed to refresh only those pixels whose image content changes between frames. Also the bistable photonic integrated circuit has similar applications to electronic paper, which may obtain an image from an external source and store that image. The bistable photonic integrated circuit can also be used in an electronic blackboard where an "image" is written with a light pen. The electronic blackboard may be erased by having a shorting transparent membrane over each pixel (e.g., ITO coated plastic) that when pressed, shorts across OLED. Finally, given its digital response to a SET or RESET pulse, the photonic integrated circuit can be used as a building block of photonic logic circuits. Taken alone, the integrated OLED/photodetector can be used in linear circuit applications such as automatic display brightness control and monitoring.

EXPERIMENTAL

A device was fabricated in accordance with one embodiment of the present invention using the following materials and thicknesses:

| | |
|---|---|
| substrate: | commercially available glass substrate; |
| first electrode (anode): | 1500 Å, transparent, conducting ITO (with a sheet resistance of ~40 ohms/square); |
| hole transport layer: | 400 Å, α-NPD; |
| emissive layer: | 200 Å, CBP:Ir(ppy)$_3$, |
| exciton blocking layer: | 80 Å, BCP; |
| electron transport layer: | 200 Å, Alq$_3$; |
| second electrode: | 120 Å, Mg—Ag/ITO; |
| p-doped layer: | 500 Å, MTDATA:F$_4$-TCNQ |
| photodetector active region: | 480 Å, 16 alternating layers of a 30 Å thick CuPc layer and a 30 Å thick PTCBI layer; |
| exciton blocking layer: | 150 Å, BCP; and |
| third electrode (cathode): | 1000 Å, Al. |

A glass substrate precoated with ITO was obtained. The ITO was patterned into 2-mm-wide stripes (710, FIG. 7) using conventional photolithography to form first electrodes as shown in FIG. 7 (electrodes 710). After solvent cleaning and exposure to O$_2$ plasma for 5 min, the substrate was immediately loaded into a vacuum system with a base pressure of <10$^{-6}$ Torr. The α-NPD hole transport layer was then deposited onto the first electrode, followed by the emissive layer, the BCP exciton blocking layer, and the Alq$_3$ electron transport layer, in that order, all by vacuum thermal evaporation. The Mg:Ag layer was deposited through a shadow mask by coevaporation of Mg and Ag at a mass ratio of 20:1, resulting in a OLED area of 2×2 mm$^2$ (730, FIG. 7). The sample was immediately transferred through a load lock to a sputtering chamber with minimal exposure to the atmosphere. Then, a 500 Å thick layer of ITO was deposited through the same shadow mask by radio frequency magnetron sputtering in 5 mTorr of Ar at a power of 5 W at a rate of approximately 3 Å/min to complete a OLED structure. The Mg:Ag layer and the ITO layer formed an electrode similar to electrode 720 of FIG. 7.

After the ITO sputtering, the sample was transferred into an ultra-high vacuum organic molecular beam deposition chamber with a base pressure of 1×10$^{-10}$ Torr. A layer of MTDATA doped with 2 wt % F$_4$-TCNQ was deposited onto the OLED cathode. This p-doped layer reduces the dark current of the photodetector while not compromising its quantum efficiency. The 16 alternating layers of the photodetector active region were then deposited by vacuum thermal evaporation, with the first CuPc layer in contact with the MTDATA of the p-doped layer. Then, the second blocking layer was deposited by vacuum thermal evaporation on top of the active region. The sample was transferred to a separate vacuum chamber. The Al cathode was evaporated at 1×10$^{-6}$ Torr through a shadow mask with an opening of 0.8×0.8 mm$^2$ (720, FIG. 7) aligned to the center of the OLED. The resultant device appeared similar to those illustrated in FIG. 7, where electrode 730 is 2×2 mm.

Figure 8:
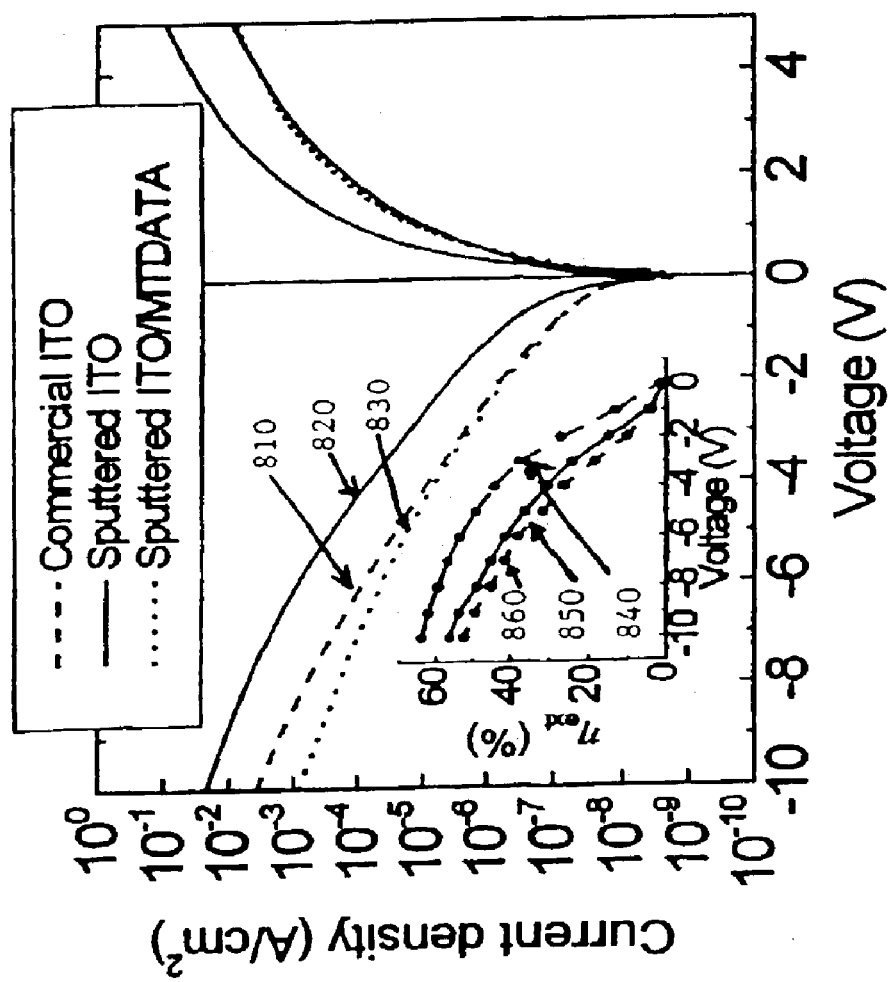
FIG. 8 shows the current density versus voltage characteristic of devices using different types of first electrodes, in accordance with an embodiment of the present invention.

Devices similar to that described above were fabricated on different first electrodes including commercial ITO, a sputtered ITO, and a sputtered ITO doped with MTDATA. FIG. 8 illustrates the current density versus voltage characteristic of an embodiment of the invention when different types of first electrodes are used. Plot 810 illustrates the current density (A/cm$^2$) for a device using commercial ITO. Plot 820 illustrates the current density (A/cm$^2$) for a device having a photodetector deposited onto a sputtered ITO anode. Plot 830 illustrates the current density (A/cm$^2$) for a device having a p-doped MTDATA layer inserted between first electrode and the first CuPc layer. When the active region of the photodetector is deposited onto the sputtered ITO anode used in the photonic integrated circuit, the reverse-bias dark current is higher than that obtained by using commercial ITO precoated on glass substrates. A dramatic decrease in the dark current is observed, however, when a p-doped MTDATA layer is inserted between first electrode and the first CuPc layer.

The inset of FIG. 8 illustrates the external quantum efficiencies, $\eta_{ext}$, of these devices, which use different types of first electrodes, in accordance with an embodiment of the present invention. The external quantum efficiencies were measured using a $\lambda$=530 nm monochromatic beam of light. A calibrated Si photodetector is used to determine the intensity. Plot 840 illustrates the quantum efficiency for a device using commercial ITO. Plot 850 illustrates the quantum efficiency for a device having a photodetector deposited onto a sputtered ITO anode. Plot 860 illustrates the quantum efficiency for a device having a p-doped MTDATA layer inserted between first electrode and the first CuPc layer. The $\eta_{ext}$ of the photodetector with a sputtered ITO anode is lowered by <15% at −10 V than that using a commercial ITO anode, both corresponding to internal quantum efficiencies of close to 100% as the sputtered ITO is approximately 10% less transparent than the commercial ITO.

Figure 9:
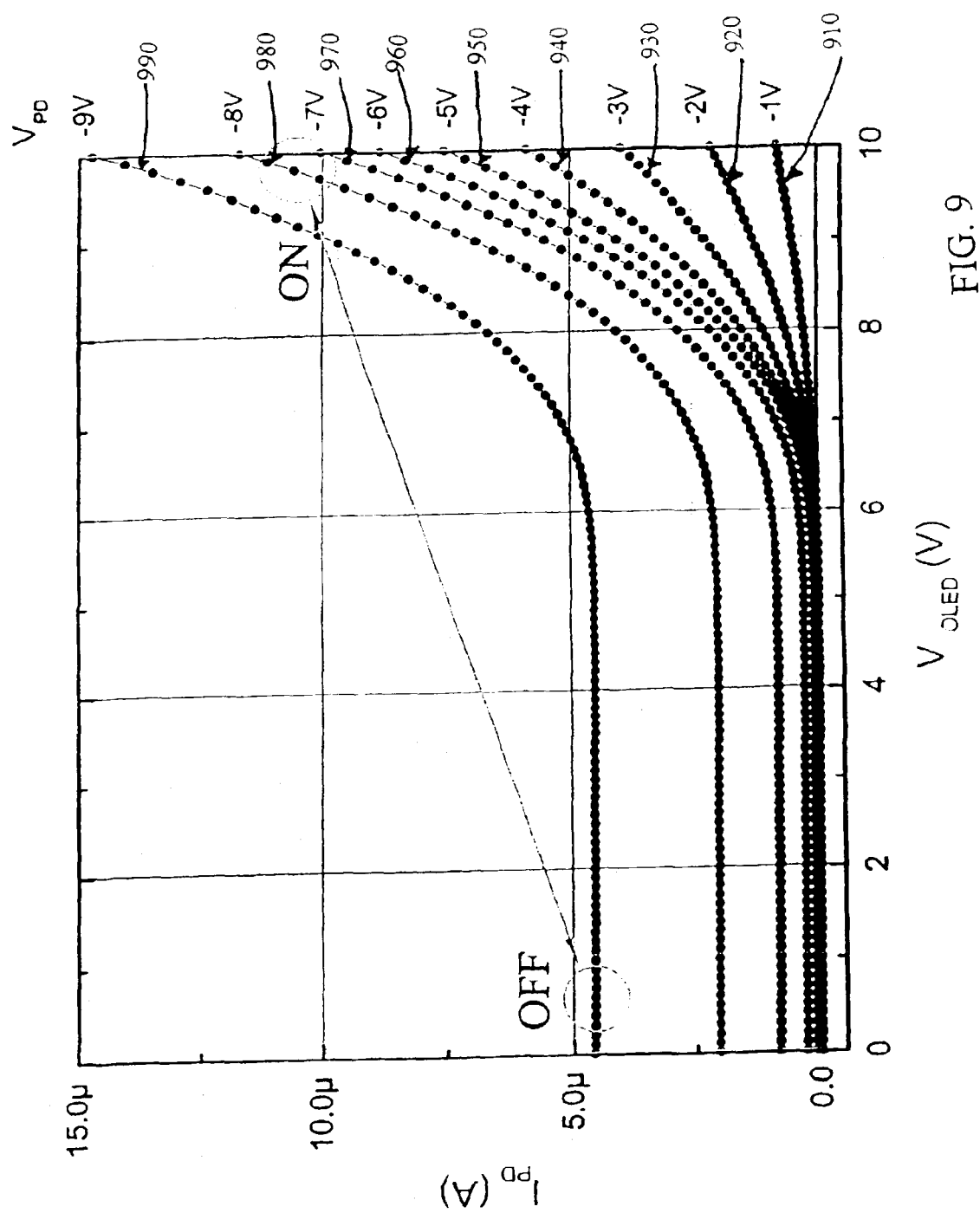
FIG. 9 shows the relationship between photodetector current and organic light emitting device (OLED) voltage at various photodetector drive voltages for an embodiment of the invention.

FIG. 9 shows the relationship between photodetector current ($I_{PD}$) and organic light emitting device (OLED) voltage ($V_{OLED}$) at various photodetector drive voltages ($V_{PD}$) for an embodiment of the invention. For example, plots 910, 920, 930, 940, 950, 860, 970, 980, and 990 illustrate changes in $I_{PD}$ as $V_{OLED}$ is increased when $V_{PD}$ is set at −1V, −2V, −3V, −4V, −5V, −6V, −7V, −8V, and −9V, respectively. As illustrated by various plots in FIG. 6, $I_{PD}$ is predominantly due to the detector dark current at low values of $V_{OLED}$. For example, $I_{PD}$ is 600 pA at −1V and it increases to 4.5 µA at −9 V. Thus, at high $V_{PD}$, $V_{OLED}$ must be increased to raise the photocurrent well above the dark current to turn on the device.

Figure 10:
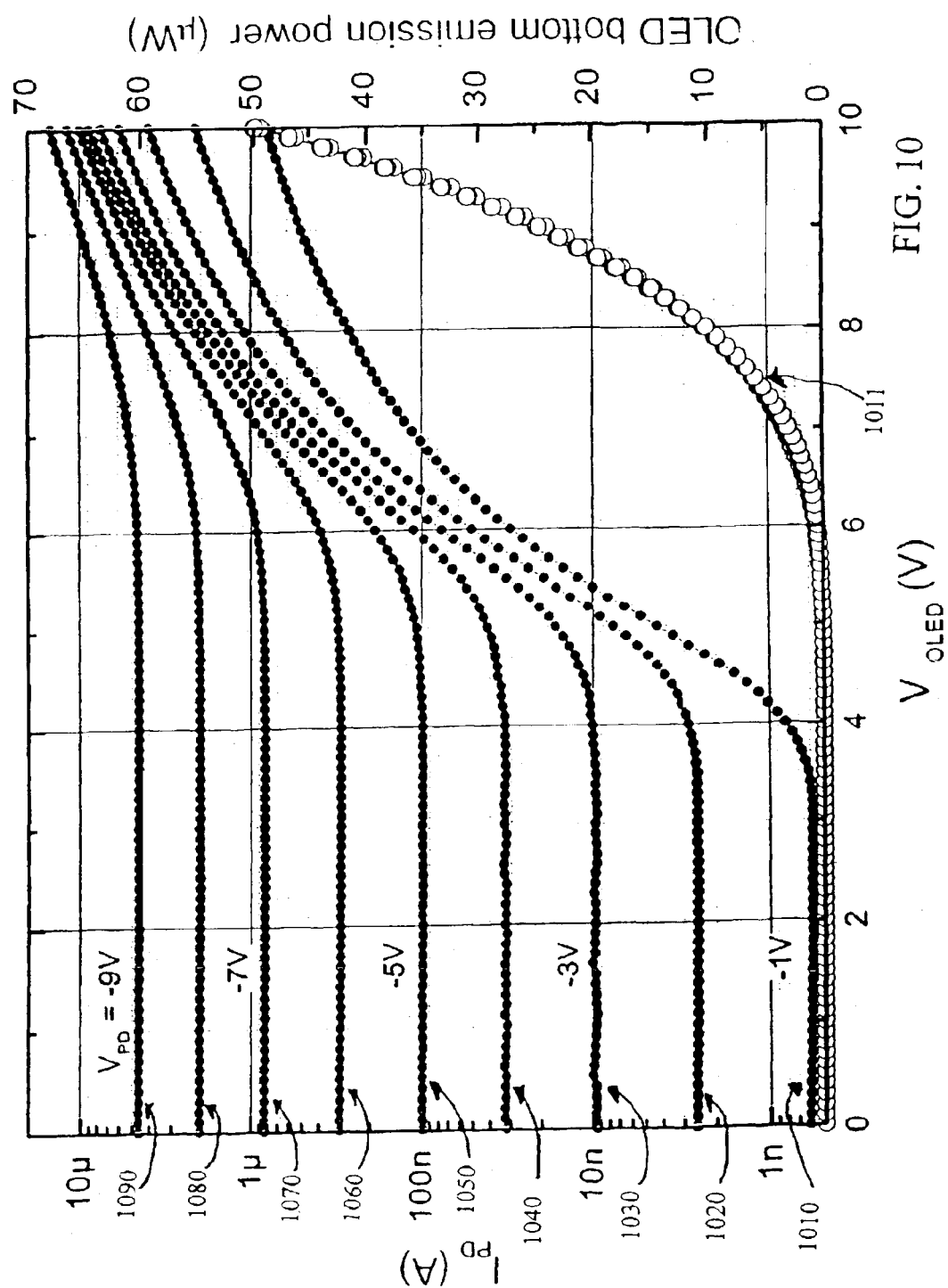
FIG. 10 shows the relationship between photodetector current and OLED drive voltage and the relationship between OLED bottom emission power and OLED drive voltage at various photodetector drive voltages for an embodiment of the present invention.

FIG. 10 shows the relationship between photodetector current ($I_{PD}$) and OLED drive voltage ($V_{OLED}$) and the relationship between OLED bottom emission power ($\alpha P_{bot}$) and OLED drive voltage ($V_{OLED}$) at various photodetector drive voltages ($V_{PD}$) for an embodiment of the present invention. Plots 1010, 1020, 1030, 1040, 1050, 1060, 1070, 1080, and 1090 illustrate changes in $\alpha P_{bot}$ and $I_{PD}$ as $V_{OLED}$ is increased when $V_{PD}$ is set at −1V, −2V, −3V, −4V, −5V, −6V, −7V, −8V, and −9V, respectively. Plot 1011 illustrates the photodetector response to light emitted by the OLED. As the amount of emitted light approaches zero at low voltages, the photodetector dark current establishes a floor which may be different for each photodetector bias voltage. For a discrete OLED, the luminance of the EL emission through the substrate is $P_{bot}$=2300±100 cd/m$^2$ (or 1.43 mW/cm$^2$) at 10 V. This corresponds to a quantum efficiency of 2.2±0.1%. The ratio of the light emitted through the cathode to the light emitted through the substrate is $\alpha$=0.50±0.05 for the OLED when the Mg—Ag layer has a thickness of 120 Å. This results in a total quantum efficiency of 3.3±0.2%.

With a photodetector integrated on top of the OLED, however, nearly 100% of the OLED top emission is coupled with the photodetector. As shown in FIG. 9, the photocurrent is approximately 10 µA with $V_{PD}$=−9V and $V_{OLED}$=10 V. This corresponds to an absorbed optical power density of 3.6 mW/cm$^2$ at $\lambda$=530 nm, while $\alpha P_{bot}$=0.72 mW/cm$^2$ in this case, as best illustrated by plot 1090. This enhancement in the extraction efficiency of the OLED top emission is partially due to the higher refractive index of the photodetector organic layers (n≈1.8), which is better matched to that of the sputtered ITO than to that of air. It is also believed that microcavity effects may also contribute to the observed sensitivity enhancement due to the addition of the photodetector and its reflecting Al cathode.

Figure 11:
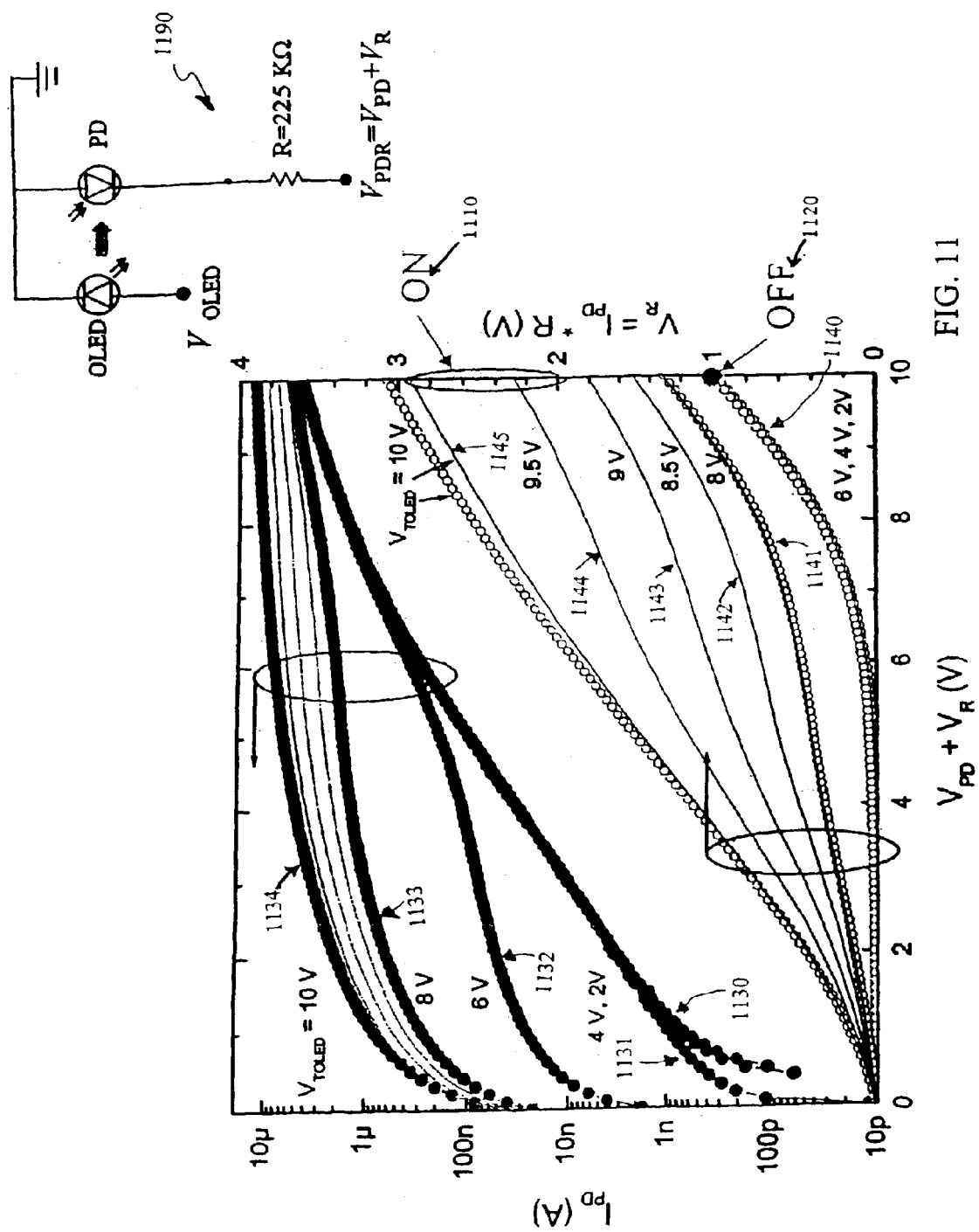
FIG. 11 shows: (1) the relationship between photodetector current ($I_{PD}$) and photodetector drive voltage ($V_{PD}$) plus resistor voltage ($V_R$); and (2) the relationship between resistor voltage ($V_R$) photodetector drive voltage ($V_{PD}$) plus resistor voltage ($V_R$), both at various OLED drive voltages, in accordance with an embodiment of the present, invention.

FIG. 11 shows: (1) the relationship between photodetector current ($I_{PD}$) and photodetector drive voltage ($V_{PD}$) plus resistor voltage ($V_R$); and (2) the relationship between resistor voltage ($V_R$) photodetector drive voltage ($V_{PD}$) plus resistor voltage ($V_R$), both at various OLED drive voltages, in accordance with an embodiment of the present invention for circuit 1190. Plots 1130, 1131, 1132, 1133 and 1134 illustrate the relationship between $I_{PD}$ and $V_{PD}+V_R$ at $V_{OLED}$=2V, 4V, 6V, 8V, and 10V, respectively. Plots 1140, 1141, 1142, 1143, 1144, and 1145 illustrate the relationship between $V_R$ and $V_{PD}+V_R$ at $V_{OLED}$=6V, 8V, 8.5V, 9V, 9.5V, and 10V, respectively FIG. 11 also shows the direct current (DC) operating points of two stable states of the fabricated device, in accordance with one embodiment of the present invention. In FIG. 11, range 1110 corresponds to the DC operating range of the fabricated device in its HIGH state, whereas range 1120 corresponds to the DC operating point of the fabricated device in its LOW state. Both transistors (550 and 610 in FIG. 6) are set at threshold voltages of $V_{T1}$=$V_{T2}$−1.2 V. With $V_S$=−10 V, in the HIGH state $V_{OLED}$≈10 V, $V_{PD}$≈−7.5 V, $V_{g1}$≈−2.5 V<$V_{T1}$<0, and $I_{PD}$≈11 µA. With $V_S$=−10 V, in the LOW state $V_{OLED}$≈0 V, $V_{PD}$≈−9.0 V, $V_{g1}$=−1.0 V>$V_{T1}$, and $I_{PD}$≈4.5 µA. To test for proper circuit operation, R=225 kΩ is connected in series to the photodetector. The voltage drop across the resistor, $V_R$, is then measured as a function of $V_s$ and $V_{OLED}$. As shown in FIG. 8, $V_R$≤1V when $V_S$=−10V and $V_{OLED}$≤2V; whereas 2V<$V_R$<3V with $V_S$=−10V and 9V<$V_{OLED}$<10V. As $V_R$=−$V_{g1}$, these two measures correspond to the LOW and HIGH states of the fabricated device, respectively.

Figure 12:
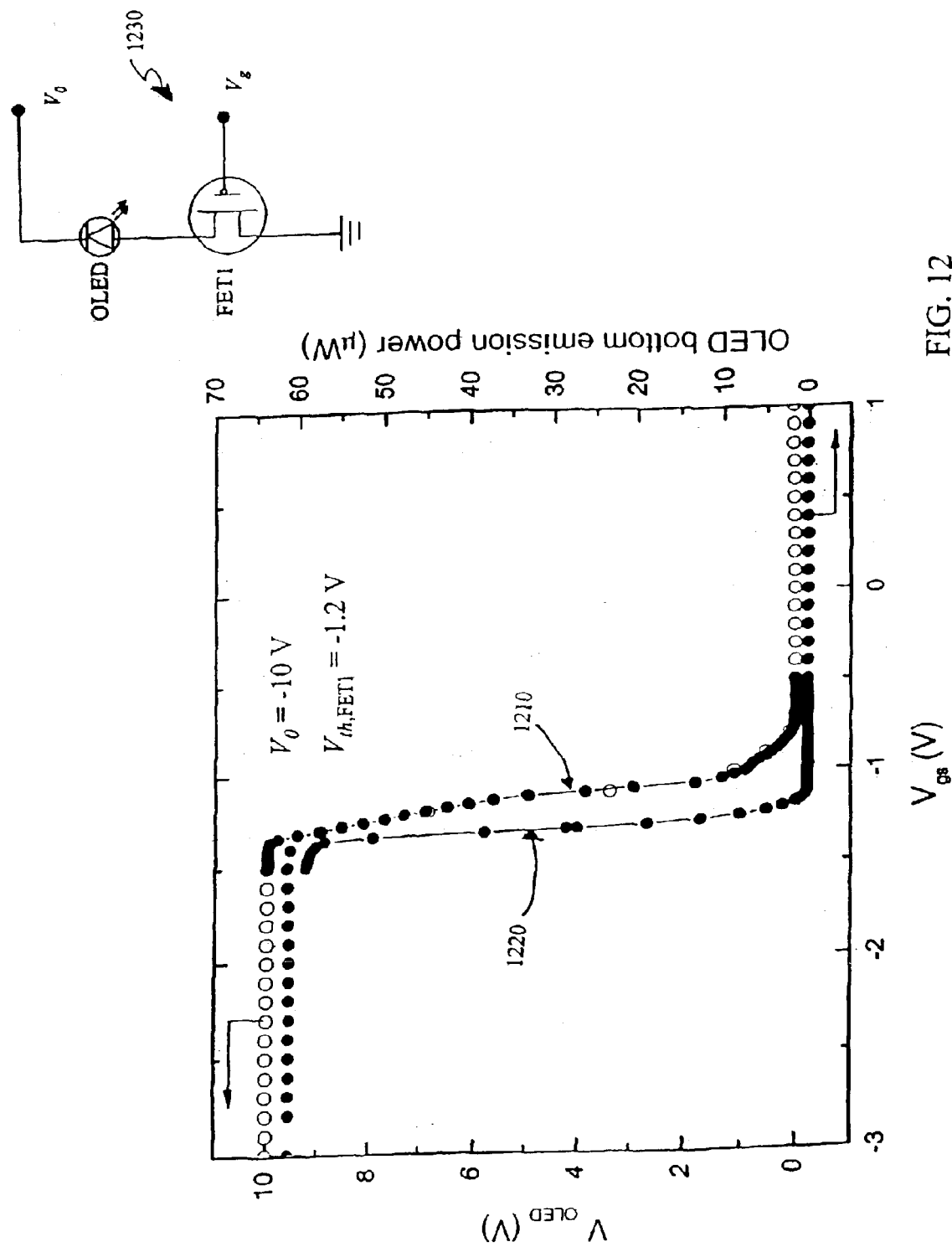
FIG. 12 shows the relationship between OLED drive voltage and gate-source voltage of a transistor ($V_{gs}$) and the relationship between OLED bottom emission power and $V_{gs}$ for an embodiment of the present invention.

FIG. 12 shows the relationship between OLED drive voltage and gate-source voltage of a transistor ($V_{gs}$) and the relationship between OLED bottom emission power and $V_{gs}$ for an embodiment of the present invention, for circuit 1230. Plot 1210 illustrates OLED drive voltage as a function of $V_{gs}$, whereas plot 1220 illustrates OLED bottom emission power as a function of $V_{gs}$. Both transistors (550 and 610 in FIG. 6) are set at threshold voltages Of $V_{T1}$=$V_{T2}$=−1.2 V. FIG. 12 shows that the emission of an OLED may be switched between two states over a relatively narrow range of gate voltages.

Figure 13:
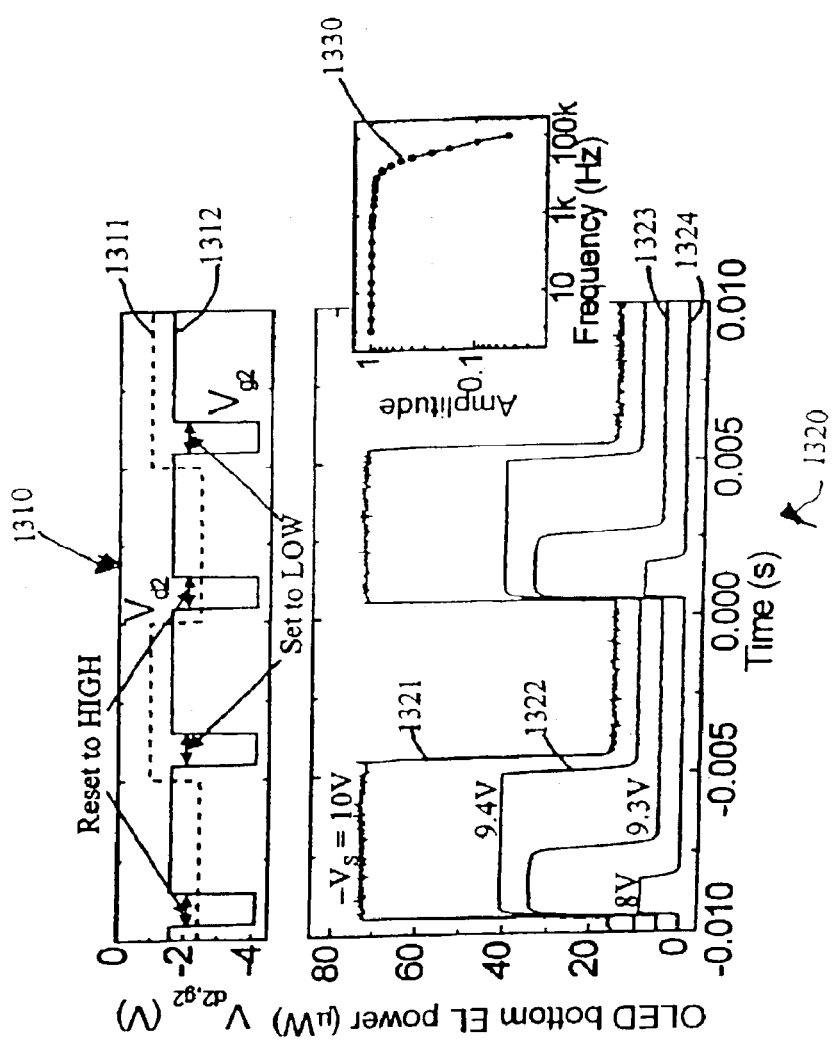
FIG. 13 shows the OLED bottom emission power of an embodiment of the present invention as a function of time at various source voltages of a transistor.

FIG. 13 illustrates the optical bistability of an embodiment of the present invention, as $V_S$ was varied from 0 to −10 V. The input of $V_{d2}$ and $V_{g2}$ are shown in the upper panel 1310 of FIG. 13. Plot 1311 represents $V_{d2}$. Plot 1312 represents $V_{g2}$. The $V_{g2}$ 1312 is delayed from $V_{d2}$ 1311 by $t_d$=0.5 ms. Both $V_{d2}$ and $V_{g2}$ have a pulse width of $t_w$=1 ms. During the pulse window of $V_{g2}$, T2 is turned on, setting $V_{g1}$ to −0.95 V or −2.45 V. This, in turn, sets the photonic integrated circuit to LOW or reset it to HIGH.

The waveforms of OLED bottom EL emission intensity at different $V_S$ are shown in the lower panel 1320 of FIG. 13. Plots 1321, 1322, 1323, and 1324 illustrate OLED bottom EL emission intensity at $V_S$ of −10V, 9.4V, 9.3V, and 8V. The waveforms are shifted vertically for clarity. At $V_S$=−8 V, OLED is on during the reset window. The HIGH state, however, is not stable as OLED turns off when T2 is switched off. As $V_S$ is increased, OLED remains on for a brief period after T2 is switched off. At $V_S$=~9.4 V, the HIGH state is almost fully latched between two pulses. The stable HIGH state is clearly achieved with $V_S$=−10 V (i.e., OLED is turned on at the onset of the RESET window). OLED remains on until the onset of the SET window. At the onset of the SET window, OLED is turned off and remains off until the next RESET pulse. The RESET or SET windows can be as narrow as 60 ns to make the photonic integrated circuit switch between the two stable states.

The inset 1336 of the lower panel 1320 of FIG. 13 shows the frequency response of the relative peak-to-valley amplitude of the OLED bottom EL emission intensity. The 3 dB bandwidth is 25 kHz, and the roll-off is approximately −18 dB/decade due to the two poles of the circuit. This represents a lower limit of the actual bandwidth of the photonic integrated circuit. A Si photodetector used to measure the OLED emission intensity, which has a response time of ~2 µs. Further, measurements of the capacitance of the circuit elements show that the frequency response is primarily limited by the RC time constant of ≧5 µs between the OLED resistance and the transistor capacitance.

Embodiments of the present invention provide an organic photonic integrated circuit which enhances optical bistability by integrating a transparent OLED with an organic photodetector. The bistable circuit may have a 3 dB bandwidth of 25 kHz. The organic photodetector may be efficient over a broad spectral range from 450 nm to 750 nm. Therefore, it can be integrated with OLEDs of different colors to achieve bistability in full color display applications. The photonic integrated circuit can be electrically or optically reset using pulses as narrow as 60 ns. The photonic integrated circuit has potential applications in image-retaining displays and photonic logic circuits.

Many different types of OLEDs are known, including top emission OLEDs (TOLEDs), flexible OLEDs, fluorescent OLEDs, phosphoresecent OLEDs, and other types of OLEDs. It is intended that embodiments of the invention may be practiced in connection with all types of OLEDs.

Several embodiments of the present invention are specifically illustrated and described herein. It will be appreciated, however, that modifications and variations of the present invention are covered by the above teachings and within the purview of the appended claims without departing from the spirit and intended scope of the invention.

What is claimed is:

1. A device, comprising:
   a pixel having a plurality of bistable subpixels, each subpixel having an ON state and an OFF state;
   a plurality of power lines, wherein a different power line is coupled to each bistable subpixel; and
   circuitry connected to the plurality of power lines, wherein the circuitry is capable of individually modulating the pulse width of a power signal transmitted through each power line;
   wherein each subpixel includes a first light emitting device that emits light when the subpixel is in the ON state; and
   wherein each subpixel has substantially the same size and emits substantially the same spectrum of light in the ON state.

2. The device of claim 1, wherein each subpixel further comprises a photodetector that detects the light emitted by the first light emitting device and provides feedback which is used to maintain the subpixel in the ON state.

3. The device of claim 1, wherein each subpixel further comprises:
   a second light emitting device; and
   a photodetector that detects the light emitted by the second light emitting device and provides feedback which is used to maintain the subpixel in the ON state.

4. The device of claim 3, wherein the second light emitting device is coupled to a power line that provides an unmodulated power signal.

5. The device of claim 1, wherein the number of grey levels that may be emitted by the pixel is greater than the number of subpixels.

6. The device of claim 1, wherein a first subpixel is connected to a first power line and a second subpixel is connected to a second power line, and wherein the circuitry provides power to the first power line for a first percentage of time, and that provides power to the second power line for a second percentage of time, wherein the first percentage of time and the second percentage of the time are different.

7. The device of claim 6, wherein the second percentage of time is 50% and the first percentage of time is 100%.

8. The device of claim 6, wherein the circuitry rotates the percentage of power provided to the first and second power lines.

9. The device of claim 1, wherein the first light emitting device is an organic light emitting device.

10. The device of claim 1, wherein the first light emitting device of each subpixel is electrically connected to receive the power signal from the power line coupled to the respective subpixel.

11. The device of claim 10, wherein each subpixel is further coupled to a control signal input line, the control signal input line to receive a data signal to change a state of the subpixel between the ON state and the OFF state.

12. The device of claim 1, further comprising a plurality of the pixels, wherein a same power line of the plurality of power lines is coupled to a same respective subpixel in each pixel.

* * * * *

UNITED STATES PATENT AND TRADEMARK OFFICE
CERTIFICATE OF CORRECTION

PATENT NO. : 7,053,412 B2
APPLICATION NO. : 10/607138
DATED : May 30, 2006
INVENTOR(S) : Michael Hack et al.

It is certified that error appears in the above-identified patent and that said Letters Patent is hereby corrected as shown below:

In Figure 1, change "Electron Transpor Layer" to -- Electron Transport Layer--

Column 2, lines 59, insert --intensities-- after "different"

Column 3, line 24, change "maybe" to -- may be --

Column 4, line 64, change "4,4-dicarbazole-biphenyl" to -- 4,4'-dicarbazole-biphenyl--

Column 5, line 49, change "most as all of the" to -- most of all of the--

Column 5, line 65, change "(3-methyl phenylphenyl-amino" to -- (3-methyl-phenyl-phenyl-amino)--

Column 10, line 13, change "acheive" to --achieve--

Column 11, line 5, change "changeover" to -- change over--

Column 11, line17, change "acheive" to --achieve--

Column 11, line 41, change "nay" to --may--

Column 12, line 9, change "soon" to --so on--

Column 12, line 24, change "that" to --than--

Column 13, line 41, insert "on" after "depend"

Column 16, line 14, change "resistor voltage ($V_R$) photodetector" to -- resistor voltage ($V_R$) and photodetector --

Column 16, line 22, insert a period after "respectfully"

Column 17, line 2, change "~9.4 V" to -- -9.4 V --

UNITED STATES PATENT AND TRADEMARK OFFICE
CERTIFICATE OF CORRECTION

PATENT NO.       : 7,053,412 B2
APPLICATION NO.  : 10/607138
DATED            : May 30, 2006
INVENTOR(S)      : Michael Hack et al.

It is certified that error appears in the above-identified patent and that said Letters Patent is hereby corrected as shown below:

Column 17, line 11, change "1336" to -- 1330 --

Signed and Sealed this

Fourteenth Day of November, 2006

JON W. DUDAS
*Director of the United States Patent and Trademark Office*